United States Patent
Elce et al.

(10) Patent No.: US 9,932,432 B2
(45) Date of Patent: Apr. 3, 2018

(54) POLYMERS OF MALEIMIDE AND CYCLOOLEFINIC MONOMERS AS PERMANENT DIELECTRIC MATERIALS

(71) Applicant: PROMERUS, LLC, Brecksville, OH (US)

(72) Inventors: Edmund Elce, Brecksville, OH (US); Royce Groff, Brecksville, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 15/147,973

(22) Filed: May 6, 2016

(65) Prior Publication Data

US 2016/0326292 A1    Nov. 10, 2016

Related U.S. Application Data

(60) Provisional application No. 62/157,607, filed on May 6, 2015.

(51) Int. Cl.

| | | |
|---|---|---|
| *C08F 232/08* | (2006.01) | |
| *C08G 61/12* | (2006.01) | |
| *G03F 7/039* | (2006.01) | |
| *G03F 7/16* | (2006.01) | |
| *G03F 7/20* | (2006.01) | |
| *G03F 7/32* | (2006.01) | |
| *G03F 7/40* | (2006.01) | |
| *G03F 7/004* | (2006.01) | |

(52) U.S. Cl.
CPC .......... *C08F 232/08* (2013.01); *C08G 61/124* (2013.01); *G03F 7/004* (2013.01); *G03F 7/039* (2013.01); *G03F 7/16* (2013.01); *G03F 7/20* (2013.01); *G03F 7/327* (2013.01); *G03F 7/40* (2013.01); *C08G 2261/12* (2013.01); *C08G 2261/3325* (2013.01)

(58) Field of Classification Search
CPC . C08F 232/08; C08G 61/124; C08G 2261/12; C08G 2261/3325; G03F 7/004; G03F 7/039; G03F 7/40; G03F 7/16; G03F 7/20; G03F 7/327
See application file for complete search history.

(56) References Cited

U.S. PATENT DOCUMENTS

| | | | |
|---|---|---|---|
| 5,212,043 A * | 5/1993 | Yamamoto | G03F 7/012 430/165 |
| 6,165,672 A | 12/2000 | Jung | |
| 2012/0129101 A1* | 5/2012 | Onishi | C08F 222/06 430/283.1 |
| 2014/0087293 A1 | 3/2014 | Kandanarachchi et al. | |
| 2015/0079506 A1* | 3/2015 | Kandanarachchi | C09D 145/00 430/18 |

FOREIGN PATENT DOCUMENTS

| | | |
|---|---|---|
| EP | 1 300 727 A2 | 4/2003 |
| WO | WO 2016/179452 A1 * | 5/2016 |

OTHER PUBLICATIONS

"acyloxyl radicals" source: PAC, 1995, 67, 1307 (Glossary of class names of organic compounds and reactivity intermediates based on structure (IUPAC Recommendations 1995)) on p. 1312, obtained from IUPAC Gold Book https://goldbook.iupac.org online.*

* cited by examiner

*Primary Examiner* — Cynthia Hamilton
(74) *Attorney, Agent, or Firm* — Balaram Gupta

(57) ABSTRACT

Various cycloolefinic/maleic anhydride/maleimide polymers and compositions thereof useful for forming self-imageable films encompassing such polymers are disclosed. Such polymers encompass norbornene-type repeating units, maleimide repeat units and maleic anhydride-type repeating units where at least some of such maleic anhydride-type repeating units have been ring-opened. The films formed from such polymer compositions provide self imageable, low-k, thermally stable layers for use in microelectronic and optoelectronic devices.

20 Claims, 4 Drawing Sheets

POLYMERS OF MALEIMIDE AND CYCLOOLEFINIC MONOMERS AS PERMANENT DIELECTRIC MATERIALS

CROSS REFERENCE TO RELATED APPLICATIONS

This application claims the benefit of U.S. Provisional Application No. 62/157,607, filed May 6, 2015, which is incorporated herein by reference in its entirety.

TECHNICAL FIELD

The present invention relates to a series of polymers of maleimide and cycloolefinic monomers having utility as permanent dielectric materials. More specifically, the present invention relates to a series of unsubstituted, mono- or di-substituted maleimide monomers copolymerized with a variety of norbornene-type cycloolefinic monomers and maleic anhydride in which maleic anhydride is fully or partially hydrolyzed (i.e., ring opened and fully or partially esterified). This invention also relates to methods of making these polymers and applications thereof. In particular, the polymers of this invention are found to be useful in various electronic material applications as permanent dielectrics among various other uses.

BACKGROUND

As the microelectronic devices are fabricated in smaller geometries there is an increasing demand for advanced materials that meet the stringent requirements of confined smaller geometries. In particular, sub-micron device geometries have become common place in the fabrication of a variety of microelectronics packages for memory and logic integrated circuits (ICs), liquid crystal displays (LCDs), organic light emitting diodes (OLEDs) and other radio frequency (Rf) and microwave devices. For example, devices such as radio frequency integrated circuits (RFICs), micro-machine integrated circuits (MMICs), switches, couplers, phase shifters, surface acoustic wave (SAW) filters and SAW duplexers, have recently been fabricated with submicron dimensions.

With such smaller geometries comes a requirement for dielectric materials with low dielectric constants to reduce or eliminate any cross-talk between adjacent signal lines or between a signal line and a device feature (e.g. a pixel electrode) due to capacitive coupling. Although many low dielectric (low-K) materials are available for microelectronic devices, for optoelectronic devices such materials must also be broadly transparent in the visible light spectrum, not require high temperature processing (greater than 300° C.) that would be incompatible with other elements of such an optoelectronic device, and be both low-cost and feasible for large scale optoelectronic device fabrication.

Thus, it would be desirable to have a material capable of forming a self-imageable layer to avoid the need for depositing a separate imaging layer. Such material should also be easy to apply to a substrate, have a low dielectric constant (3.9 or less) and thermal stability to temperatures in excess of 250° C. Of course, it is also desirable to have such materials available at a lower cost and feature such properties as positive or negative tone photoimaging capability, aqueous base developing capability, high transparency after heat stress and low weight loss at curing temperatures. It has been reported that acrylic polymers, which are inexpensive, offer good photoimaging properties and are aqueous base developable, see for example, Japanese Patent Application Laid-open No. Hei 5-165214 and the radiation-sensitive resin composition comprising an alicyclic olefin resin disclosed in Japanese Patent Application Laid-open No. 2003-162054. Similarly, polyimides have been reported to provide good thermal stability. However, these materials have certain deficiencies and thus making them not so suitable for the applications contemplated herein. For instance, acrylics are not suitable for applications requiring high thermal stability (i.e., temperatures higher than 200° C.), and many of the polyimides in general are not suitable for either positive tone or negative tone formulations requiring aqueous base developability and generally do not exhibit desirable transparency, thus making them unsuitable in certain optoelectronic applications. Although some polyimides and polybenzoxazoles have low dielectric constants but still may not have low enough permittivity to be effective in highly integrated and/or miniaturized devices having increased wiring density and high signal speed. Furthermore, both polyimides and polybenzoxazoles require cure temperatures in excess of 300° C., thus rendering them unsuitable for many applications. One such known polyimide material is the positive tone photosensitive resin comprising a polyimide precursor and a diazoquinone-type compound disclosed in Japanese Patent No. 3,262,108.

Recently, it has been reported that certain copolymers containing norbornene-type repeat units having pendent maleimide groups and maleic anhydride-type repeat units are useful in certain microelectronic applications featuring self-image forming layer capability, when image-wise-exposed to actinic radiation, see co-pending U.S. patent application Ser. No. 14/034,682, filed Sep. 24, 2013.

However, there is still a need for cost effective permanent dielectric materials having not only self photopatternable properties but also retaining of film thickness from the unexposed regions of a positive tone formulation (i.e., low dark field loss), low thermal reflow after cure, improved stability to various chemicals and process conditions involved in the downstream process fabrication steps, such as, for example, in a device containing a redistribution layer (RDL), and/or solvent stripper operations, among others.

Thus it is an object of this invention to provide organic polymer materials having aforementioned properties for a variety of electronic and/or optoelectronic device fabrication applications.

BRIEF DESCRIPTION OF THE DRAWINGS

Embodiments in accordance with the present invention are described below with reference to the following accompanying figures and/or images. Where drawings are provided, it will be drawings which are simplified portions of a device provided for illustrative purposes only.

DETAILED DESCRIPTION

Figure 1A:
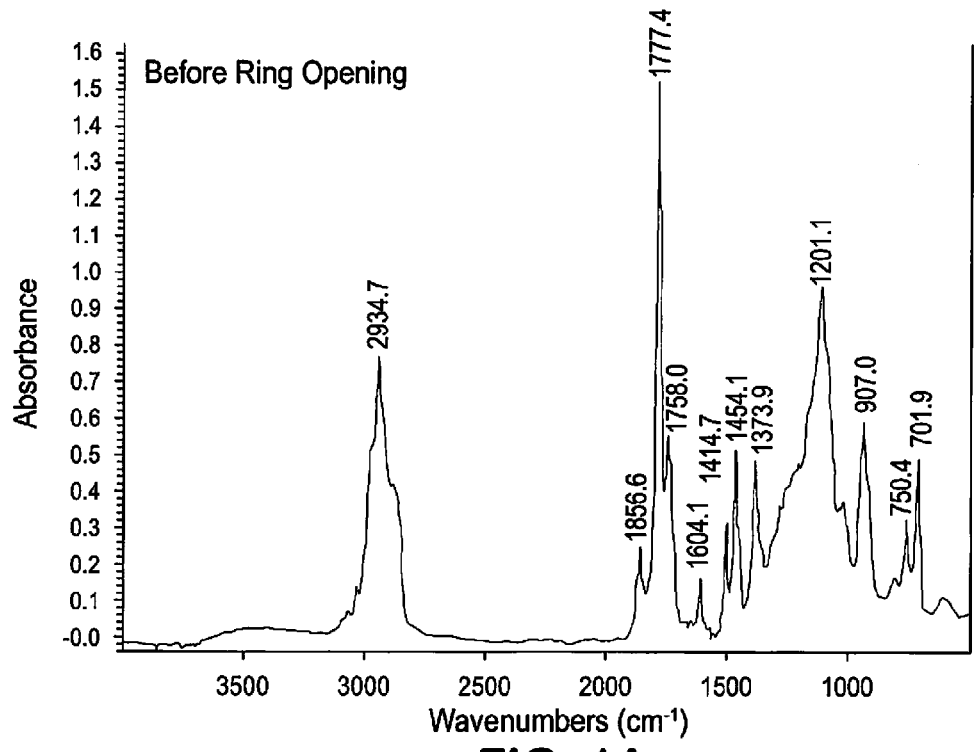
FIG. 1A shows FT-IR spectrum of a polymer of the embodiment of this invention where the maleic anhydride repeating units are not yet ring opened (COMA-MI polymer) and FIG. 1B shows FT-IR spectrum of a polymer of the embodiment of this invention where the maleic anhydride repeating units are ring opened (ROMA-MI polymer).

Embodiments in accordance with the present invention are directed to various polymers, including but not limited to, polymers that encompass at least one repeating unit derived from a certain type of norbornene-type monomer as described herein, at least one second repeating unit derived from a maleic anhydride-type monomer, as such are defined hereinafter and at least one third repeating unit derived from a maleimide, and to compositions encompassing such polymers. Such polymer compositions being capable of forming self-imageable films useful as layers in the manufacture of microelectronic and optoelectronic devices. That is to say, after image-wise exposure to actinic radiation, such layers (or films) can be developed to form patterned layers (or films), where such pattern is reflective of the image through which the layers (or films) was exposed. In this manner, structures can be provided that are, or are to become, a part of such microelectronic and/or optoelectronic devices.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol " ~~~ " denotes a position at which the bonding takes place with another repeat unit or another atom or molecule or group or moiety as appropriate with the structure of the group as shown.

As used herein, "hydrocarbyl" refers to a radical of a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "$(C_1-C_{15})$alkyl" includes methyl and ethyl groups, and straight-chained or branched propyl, butyl, pentyl, hexyl, heptyl, and various other homolog groups. Particular alkyl groups are methyl, ethyl, n-propyl, isopropyl and tert-butyl, etc. Derived expressions, such as "$(C_1-C_{15})$alkoxy", "$(C_1-C_{15})$thioalkyl" "$(C_1-C_{15})$alkoxy$(C_1-C_{15})$alkyl", "hydroxy$(C_1-C_{15})$alkyl", "$(C_1-C_{15})$alkylcarbonyl", "$(C_1-C_{15})$alkoxycarbonyl$(C_1-C_{15})$alkyl", "$(C_1-C_{15})$alkoxycarbonyl", "amino$(C_1-C_{15})$alkyl", "$(C_1-C_{15})$alkylamino", "$(C_1-C_{15})$alkylcarbamoyl$(C_1-C_{15})$alkyl", "$(C_1-C_{15})$dialkylcarbamoyl$(C_1-C_{15})$alkyl" "mono- or di-$(C_1-C_{15})$alkylamino$(C_1-C_{15})$alkyl", "amino$(C_1-C_{15})$alkylcarbonyl" "diphenyl$(C_1-C_{15})$alkyl", "phenyl$(C_1-C_{15})$alkyl", "phenylcarboyl$(C_1-C_{15})$alkyl" and "phenoxy$(C_1-C_{15})$alkyl" are to be construed accordingly.

As used herein, the expression "cycloalkyl" includes all of the known cyclic radicals. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "$(C_2-C_6)$alkenyl" includes ethenyl and straight-chained or branched propenyl, butenyl, pentenyl and hexenyl groups. Similarly, the expression "$(C_2-C_6)$alkynyl" includes ethynyl and propynyl, and straight-chained or branched butynyl, pentynyl and hexynyl groups.

As used herein the expression "$(C_1-C_4)$acyl" shall have the same meaning as "$(C_1-C_4)$alkanoyl", which can also be represented structurally as "R—CO—," where R is a $(C_1-C_3)$alkyl as defined herein. Additionally, "$(C_1-C_3)$alkylcarbonyl" shall mean same as $(C_1-C_4)$acyl. Specifically, "$(C_1-C_4)$acyl" shall mean formyl, acetyl or ethanoyl, propanoyl, n-butanoyl, etc. Derived expressions such as "$(C_1-C_4)$acyloxy" and "$(C_1-C_4)$acyloxyalkyl" are to be construed accordingly.

As used herein, the expression "$(C_1-C_{15})$perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "$(C_1-C_{15})$perfluoroalkoxy", is to be construed accordingly.

As used herein, the expression "$(C_6-C_{10})$aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "$(C_6-C_{10})$arylsulfonyl," is to be construed accordingly.

As used herein, the expression "$(C_6-C_{10})$aryl$(C_1-C_4)$alkyl" means that the $(C_6-C_{10})$aryl as defined herein is further attached to $(C_1-C_4)$alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals. Representative 5-membered heteroaryl radicals include furanyl, thienyl or thiophenyl, pyrrolyl, isopyrroyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $(C_1-C_6)$alkyl, $(C_2-C_6)$alkenyl, $(C_1-C_6)$perfluoroalkyl, phenyl, hydroxy, —$CO_2H$, an ester, an amide, $(C_1-C_6)$alkoxy, $(C_1-C_6)$thioalkyl, $(C_1-C_6)$perfluoroalkoxy, —$NH_2$, Cl, Br, I, F, —$NH(C_1-C_6)$alkyl, and —$N((C_1-C_6)$alkyl$)_2$. However, any of the other suitable substituents known to one skilled in the art can also be used in these embodiments.

The statements below, wherein, for example, $R_5$ and $R_6$ are said to be independently selected from a group of substituents, means that $R_5$ and $R_6$ are independently selected, but also that where an $R_5$ variable occurs more than once in a molecule, those occurrences are independently selected (e.g., if $R_1$ and $R_2$ are each contains a group of formula (A), $R_5$ can be hydrogen in $R_1$, and $R_5$ can be methyl in $R_2$). Those skilled in the art will recognize that the size and nature of the substituent(s) can affect the number and nature of other substituents that can be present.

It should be noted that any atom with unsatisfied valences in the text, schemes, examples and tables herein is assumed to have the appropriate number of hydrogen atom(s) to satisfy such valences.

As used herein, the terms "polymer composition," or "terpolymer composition" are used herein interchangeably and are meant to include at least one synthesized polymer or terpolymer, as well as residues from initiators, solvents or other elements attendant to the synthesis of such polymers, where such residues are understood as not being covalently incorporated thereto. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

By the term "derived" is meant that the polymeric repeating units are polymerized (formed) from, e.g., polycyclic norbornene-type monomers, in accordance with formula (I), maleic anhydride monomers of formula (II), and maleimides of formula (III) wherein the resulting polymers are formed by 2,3 enchainment of norbornene-type monomers with maleic anhydride or maleimide monomers in an alternating fashion as shown below, where X is O or N—$R_{11}$, where $R_{11}$ is as defined hereinbelow:

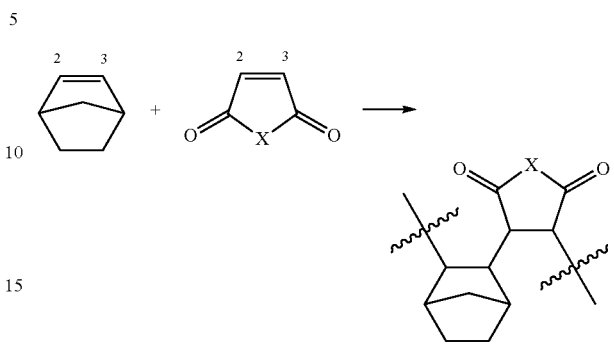

It should be understood that depending upon the monomeric compositions in a given polymer the repeat units may not always be alternating. That is to say, for example, in a polymer containing other than 50:50 molar ratios of norbornene-type monomers with combined molar amounts of maleic anhydride and maleimide monomers, the repeat units are not always alternating but with random blocks of monomers with the higher molar content.

The term "low K" refers in general to a dielectric constant less than that of thermally formed silicon dioxide (3.9) and when used in reference to a "low-K material" it will be understood to mean a material having a dielectric constant of less than 3.9.

The term "photodefinable" refers to the characteristic of a material or composition of materials, such as a polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic be employed in a pattern forming scheme to form a patterned film/layer or structure. It will be noted that such a scheme incorporates an "imagewise exposure" of the photodefinable material or layer. Such imagewise exposure being taken to mean an exposure to actinic radiation of selected portions of the layer, where non-selected portions are protected from such exposure to actinic radiation.

The phrase "a material that photonically forms a catalyst" refers to a material that, when exposed to "actinic radiation" will break down, decompose, or in some other way alter its molecular composition to form a compound capable of initiating a crosslinking reaction in the polymer, where the term "actinic radiation" is meant to include any type of radiation capable of causing the aforementioned change in molecular composition. For example, any wavelength of ultraviolet or visible radiation regardless of the source of such radiation or radiation from an appropriate X-ray and electron beam source. Non-limiting examples of suitable materials that "photonically form catalyst" include photoacid generators and photobase generators such as are discussed in detail below. It should also be noted that generally "a material that photonically forms a catalyst" will also form a catalyst if heated to an appropriate temperature. Such exposures are sometimes desirable after developing a positive tone image and to fix the images post developing by blanket exposure to a suitable radiation.

The term "cure" (or "curing") as used in connection with a composition, e.g., "a cured composition," shall mean that at least a portion of the crosslinkable components which are encompassed by the composition are at least partially crosslinked. In some embodiments of the present invention, the crosslinking is sufficient to render the polymer film insoluble in the developer and in some other embodiments the polymer film is insoluble in commonly used solvents. One skilled in the art will understand that the presence and degree of crosslinking (crosslink density) can be determined by a variety of methods, such as dynamic mechanical thermal analysis (DMTA). This method determines the glass transition temperature and crosslink density of free films of coatings or polymers. These physical properties of a cured material are related to the structure of the crosslinked network. Higher crosslink density values indicate a higher degree of crosslinking in the coating or film.

Monomers

Various first type of monomers as described herein which are part of polymer embodiments in accordance with the present invention are generally known in the art. In general, the polymers of this invention encompass a wide range of first type of "polycyclic" repeating units. As defined herein, the terms "polycyclic olefin" or "polycycloolefin" mean the same and are used interchangeably to represent several of the first type of monomeric compounds used to prepare the polymers of this invention. As a representative example of such a compound or a monomer is "norbornene-type" monomer and is generally referred to herein as addition polymerizable monomer (or the resulting repeating unit), that encompass at least one norbornene moiety such as shown below:

The simplest norbornene-type or polycyclic olefin monomer encompassed by embodiments in accordance with the present invention is norbornene itself, also known as bicyclo [2.2.1]hept-2-ene. However, the term norbornene-type monomer or repeating unit is used herein to mean norbornene itself as well as any substituted norbornene(s), or substituted and unsubstituted higher cyclic derivatives thereof. Representative examples of such monomers include but not limited to bicyclo[2.2.2]oct-2-ene, 1,2,3,4,4a,5,8,8a-octahydro-1,4:5,8-dimethanonaphthalene, 1,4,4a,5,6,7,8,8a-octahydro-1,4-epoxy-5,8-methanonaphthalene, and the like.

As mentioned above, the "norbornene-type" monomeric compounds employed in this invention can be synthesized by any of the procedures known to one skilled in the art. Specifically, several of the starting materials used in the preparation of the first type of monomers used herein are known or are themselves commercially available. The first type of monomers employed herein as well as several of the precursor compounds may also be prepared by methods used to prepare similar compounds as reported in the literature and as further described herein. See for instance, U.S. Patent Application No. US2012/0056183 A1.

In general, an economical route for the preparation of first type of monomers of formula (I), wherein m=0, relies on the Diels-Alder addition reaction in which cyclopentadiene (CPD, IV) is reacted with a suitable dienophile of formula (V) or (VI) at suitable reaction temperatures which are typically at elevated temperatures to form the monomers of formula (I) or (III) generally shown by the following reaction scheme I:

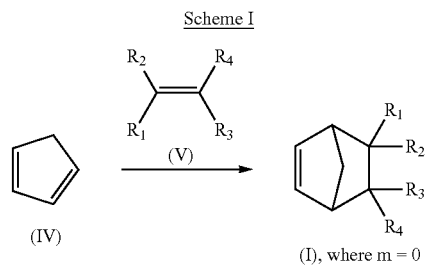

Wherein $R_1$, $R_2$, $R_3$ and $R_4$ are as defined herein.

Other monomeric compounds of formula (I), wherein m=1 or 2 can also be prepared similarly by the thermolysis of dicyclopentadiene (DCPD, VI) in the presence of a suitable dienophile of formula (V). In this approach, the compound of formula (I) formed itself acts as a dienophile and reacts with CPD, IV to give a compound of formula (I), where m=1, which can again be reacted with another molecule of CPD, IV to form a compound of formula (I), where m=2, and so on, as shown in Scheme II:

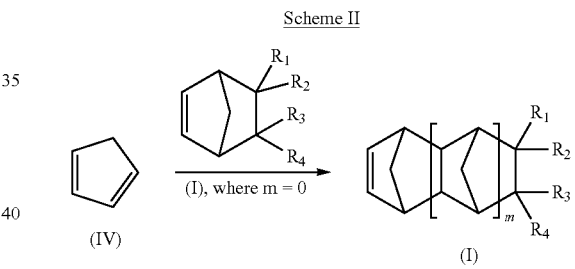

Wherein m, $R_1$, $R_2$, $R_3$ and $R_4$ are as defined herein. The dienophile of formula (V) are either generally available commercially or can be prepared following any of the known literature procedures.

Similarly, various other monomers of formulae (II) and (III) as described herein are also known in the art or are themselves commercially available. Also, monomers of formulae (II) and (III) can be synthesized by any of the procedures known to one skilled in the art.

Polymers

Embodiments in accordance with the present invention encompass polymers having at least one repeating unit derived from a norbornene-type monomer of formula (I) as defined herein, at least one repeating unit derived from a maleic anhydride-type monomer of formula (II) as defined herein, and at least one repeating unit derived from a maleimide-type monomer of formula (III) as defined herein.

Thus, in accordance with the practice of this invention there is provided a polymer comprising:

one or more distinct first type of repeating unit represented by formula (IA), each of said first type of repeating unit is derived from a monomer of formula (I):

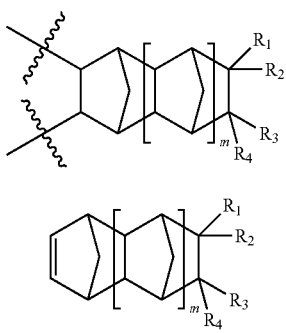

(IA)

(I)

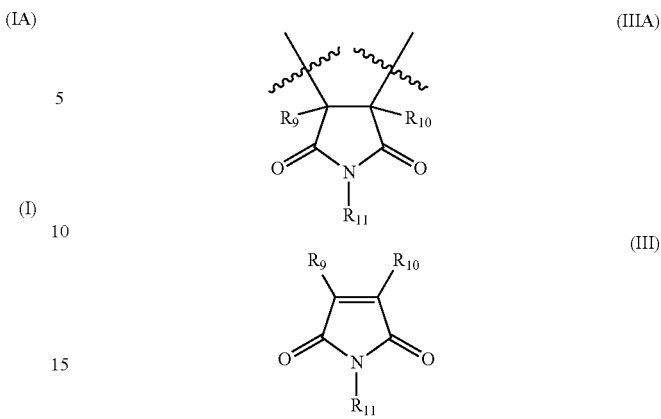

(IIIA)

(III)

wherein:

~~~ represents a position at which the bonding takes place with another repeat unit;

m is an integer 0, 1 or 2;

$R_1$, $R_2$, $R_3$ and $R_4$ independently represents hydrogen, linear or branched $(C_1-C_{16})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, —$(CH_2)_a$—(O—$(CH_2)_b)_c$—O—$(C_1-C_4)$alkyl, where a, b and c are integers from 1 to 4, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy and halogen;

one or more distinct second type of repeating unit represented by formula (IIA) or (IIB), each of said second type of repeating unit is derived from a monomer of formula (II):

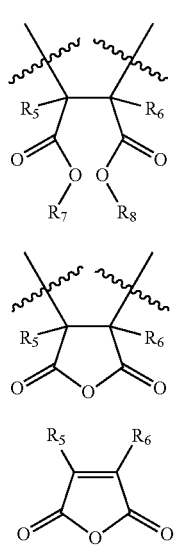

(IIA)

(IIB)

(II)

wherein:

$R_5$, $R_6$, $R_7$ and $R_8$ are each independently of one another hydrogen or linear or branched $(C_1-C_9)$alkyl, fluorinated or perfluorinated$(C_1-C_9)$alkyl, $(C_1-C_{12})$alkoxy$(C_1-C_{12})$alkyl and $(C_1-C_{12})$alkoxy$(C_1-C_{12})$alkoxy$(C_1-C_{12})$alkyl;

one or more distinct third type of repeating unit represented by formula (IIIA), each of said third type of repeating unit is derived from a monomer of formula (III):

wherein:

$R_9$ and $R_{10}$ are each independently of one another hydrogen or linear or branched $(C_1-C_{12})$alkyl, $(C_3-C_8)$cycloalkyl, $(C_6-C_{12})$aryl and $(C_6-C_{12})$aryl$(C_1-C_{12})$alkyl; and $R_{11}$ is selected from linear or branched $(C_1-C_{12})$alkyl, $(C_3-C_8)$cycloalkyl, $(C_6-C_{12})$aryl and $(C_6-C_{12})$aryl$(C_1-C_{12})$alkyl;

and wherein each of aforementioned groups, where valence is permissible, is optionally substituted with one or more groups selected from linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy$(C_1-C_6)$alkyl, acetoxy, phenyl, hydroxyphenyl and acetoxyphenyl.

In some embodiments the monomer of formula (III) where $R_{11}$ is hydrogen can also be employed. That is, an unsubstituted maleimide may also be suitable as a monomer in some embodiments of this invention.

As noted, the polymers of this invention generally encompasses at least one monomer each of formulae (I), (II) and (III). However, the polymer of this invention can encompass more than one monomer of formulae (I), (II) and (III), all such various combinations are part of this invention. Accordingly, in one of the embodiments of this invention, the polymer of this invention encompasses two or more distinct repeat units of formula (I) with at least one monomer each of formulae (II) and (III). In yet another embodiment of this invention, the polymer of this invention encompasses three or more distinct repeat units of formula (I) with at least one monomer each of formulae (II) and (III).

In another embodiment, the polymer of this invention encompasses a monomer of formula (I) wherein:

m is 0;

$R_1$, $R_2$, $R_3$ and $R_4$ are independently represents hydrogen, linear or branched $(C_1-C_{12})$alkyl, phenyl$(C_1-C_3)$alkyl, —$(CH_2)_a$—(O—$(CH_2)_b)_c$—O—$(C_1-C_4)$alkyl, where a is 1 or 2, b is 2 to 4 and c is 2 or 3.

In another embodiment, the polymer of this invention encompasses monomers of formulae (II) and (III) wherein:

$R_5$ and $R_6$ are independently of each other selected from hydrogen and methyl; each $R_7$ and $R_8$ independently of one another selected from hydrogen, methyl, ethyl, n-propyl and n-butyl;

$R_9$ and $R_{10}$ are independently of each other selected from hydrogen and methyl; and $R_{11}$ is selected from hexyl, cyclohexyl and phenyl.

Useful monomers for embodiments in accordance with the present invention are described generally herein and are further described by the monomer and substituent structures provided herein. It should further be noted that the polymer of this invention generally encompasses equal molar amounts of repeat units derived from one or more monomers of formula (I) and repeat units derived from combined molar amounts of formulae (II) and (III). That is to say that the total molar amount of one or more distinct types of formula (I) and the total molar amounts of formulae (II) and (III) are generally the same. In this regard, the three distinct types of repeat units of formulae (IA), (IIA) or (IIB) and (IIIA) in the back bone of the polymer may be mostly alternating with norbornene-type repeating unit of formula (I) with one of maleic-anhydride repeat unit of formula (IIA) or (IIB) or a maleimide type repeating unit of formula (IIIA). However, such repeat units of formulae (IA), (IIA), (IIB) or (IIIA) may also be randomly arranged or may form blocks, all such forms of polymers are part of this invention. In some embodiments, the norbornene-type repeat units are mostly alternating with the maleic-anhydride or maleimide type repeat units. In other embodiments, such polymer compositions can encompass a polymer containing two or more distinct types of norbornene-type repeating units and at least one maleic anhydride-type and at least one maleimide-type repeating unit, or a polymer containing at least one norbornene-type repeating unit and two or more distinct types of maleic anhydride and maleimide-type repeating units as further described herein.

Generally speaking, as to various possible substituents defined for $R_1$, $R_2$, $R_3$, $R_4$, it should be noted that such substituents can broadly be defined as "hydrocarbyl" group. As defined hereinabove, such definition of "hydrocarbyl" group includes any $C_1$ to $C_{30}$ alkyl, aryl, aralkyl, alkaryl, cycloalkyl, or heteroalkyl group. Representative alkyl groups include, but are not limited to, methyl, ethyl, propyl, isopropyl, butyl, isobutyl, sec-butyl, tert-butyl, pentyl, neopentyl, hexyl, heptyl, octyl, nonyl, and decyl. Representative cycloalkyl groups include, but are not limited to, adamantyl, cyclopentyl, cyclohexyl, and cyclooctyl. Representative aryl groups include, but are not limited to, phenyl, naphthyl, and anthracenyl. Representative aralkyl groups include, but are not limited to, benzyl and phenethyl. In addition, it should be noted that the hydrocarbyl groups mentioned above can be substituted, that is to say at least one of the hydrogen atoms can be replaced with, for example, ($C_1$-$C_{10}$)alkyl, haloalkyl, perhaloalkyl, aryl, and/or cycloalkyl group(s). Representative substituted cycloalkyl groups include, among others, 4-t-butylcyclohexyl and 2-methyl-2-adamantyl. A non-limiting representative substituted aryl group is 4-t-butylphenyl.

Various types of norbornene-type monomers of formula (I) can be employed in order to form the polymers of this invention which contain the first repeat units derived therefrom. More specifically, any of the known norbornene-type monomers of formula (I) can be employed. For example, various such monomers are disclosed in U.S. Patent Publication No. US 2012/0056183 A1. Exemplary monomers which form such first repeating unit include but not limited to those monomers selected from the group consisting of:

norbornene (NB);

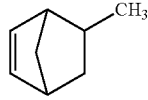

5-methylbicyclo[2.2.1]hept-2-ene (MeNB);

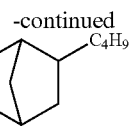

5-butylbicyclo[2.2.1]hept-2-ene (BuNB);

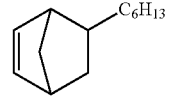

5-hexylbicyclo[2.2.1]hept-2-ene (HexNB);

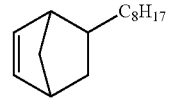

5-octylbicyclo[2.2.1]hept-2-ene (OctNB);

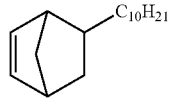

5-decylbicyclo[2.2.1]hept-2-ene (DecNB);

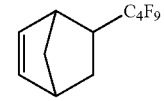

5-perflouorobutylbicyclo[2.2.1]hept-2-ene (NBC$_4$F$_9$);

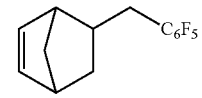

5-pentafluorobenzylbicyclo[2.2.1]hept-2-ene (PFBNB);

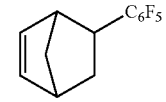

5-pentafluorophenylbicyclo[2.2.1]hept-2-ene (PFPNB);

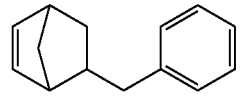

5-benzylbicyclo[2.2.1]hept-2-ene (BzNB);

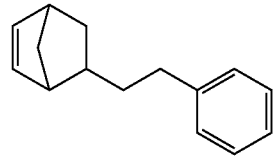

5-phenethylbicyclo[2.2.1]hept-2-ene (PENB);

1,2,3,4,4a,5,8,8a-octahydro-1,4:5,8-dimethanonaphthalene (TD);

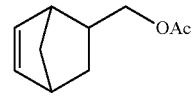

bicyclo[2.2.1]hept-5-en-2-ylmethyl acetate (MeOAcNB);

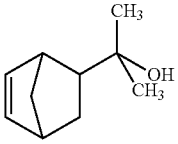

2-(bicyclo[2.2.1]hept-5-en-2-yl)propan-2-ol (NBXOH);

-continued

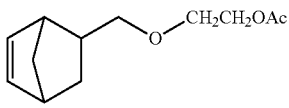

2-(bicyclo[2.2.1]hept-5-en-2-ylmethoxy)ethyl acetate (NBCH$_2$GlyOAc);

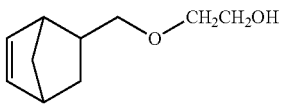

2-(bicyclo[2.2.1]hept-5-en-2-ylmethoxy)ethanol (NBCH$_2$GlyOH);

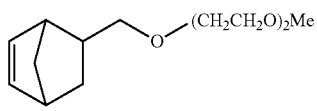

5-((2-(2-methoxyethoxy)ethoxy)methy)bicyclo[2.2.1]hept-2-ene (NBTON);

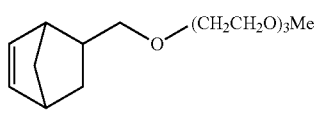

1-(bicyclo[2.2.1]hept-5-en-2-yl)-2,5,8,11-tetraoxadodecane (NBTODD);

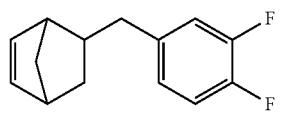

5-(3, 4-difluorobenzyl)bicyclo[2.2.1]hept-2-ene (NBCH$_2$C$_6$H$_3$F$_2$);

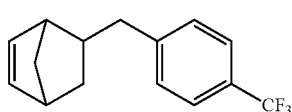

5-(4-(trifluoromethyl)benzyl)bicyclo[2.2.1]hept-2-ene (NBCH$_2$C$_6$H$_4$CF$_3$);

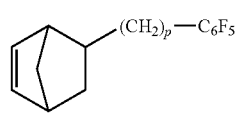

5-((perfluorophenyl)alkyl)bicyclo[2.2.1]hept-2-ene (NBalkylC$_6$F$_5$), where p = 1 (methyl, 2 (ethyl), 3 (propyl), 4 (butyl), 5 (pentyl) or 6 (hexyl);

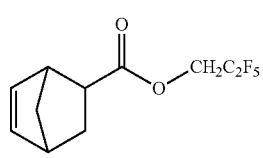

2,2,3,3,3-pentafluoropropyl bicyclo[2.2.1]hept-5-ene-carboxylate (PFPrCNB);

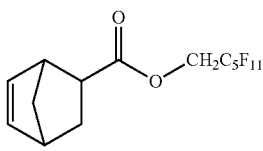

perfluoropentylmethyl bicyclo[2.2.1]hept-5-ene-2-carboxylate (PFPMeCNB);

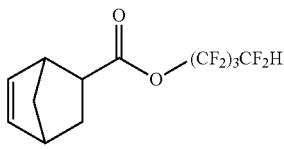

1,1,2,2,3,3,4,4-octafluorobutyl bicyclo[2.2.1.]hept-5-ene-2-carboxylate (FOCHNB);

-continued

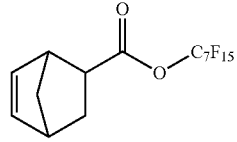

bicyclo[2.2.1]hept-5-en-2-ylmethyl perfluoroocatanate (C$_8$PFAcNB); and

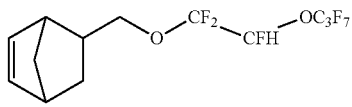

5-((1,1,2-trifluoro-2-(perfluoropropoxy)ethoxy)methyl)bicyclo[2.2.1]hept-2-ene (PPVENB).

Turning now to second repeating unit to form the polymer of this invention it is contemplated that any maleic anhydride derivative can be used as a monomer, including maleic anhydride itself. Exemplary monomers of such type include but not limited to those selected from the group consisting of:

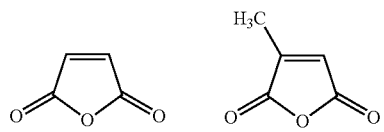

maleic anhydride;  2-methyl-maleic anhydride (3-methylfuran-2,5-dione);

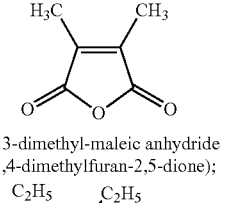

2, 3-dimethyl-maleic anhydride (3,4-dimethylfuran-2,5-dione);  2-ethyl-maleic anhydride (3-ethylfuran-2,5-dione);

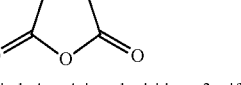

2,3-diethyl-maleic anhydride (3,4-diethyfuran-2,5-dione);  2-trifluoromethyl-maleic anhydride (3-trifluoromethylfuran-2,5-dione);

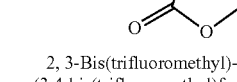

2, 3-Bis(trifluoromethyl)-maleic anhydride (3,4-bis(trifluoromethyl)furan-2,5-dione); and

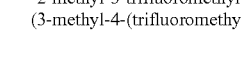

2-methyl-3-trifluoromethyl-maleic anhydride (3-methyl-4-(trifluoromethyl)furan-2,5-dione).

As noted, the polymer of this invention also contains a third repeating unit, which is derived from a maleimide monomer of formula (III). Any of the known maleimide monomers of formula (III) can be employed. Exemplary monomers which form such third repeating unit include but not limited to those monomers selected from the group consisting of:

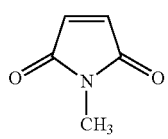
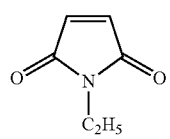

N-methylmaleimide
(1-methyl-1H-pyrrole-2,5-dione);

N-ethylmaleimide
(1-ethyl-1H-pyrrole-2,5-dione);

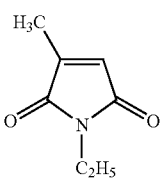

3-methyl-N-ethylmaleimide
(1-ethyl-3-methyl-1H-pyrrole-2,5-dione);

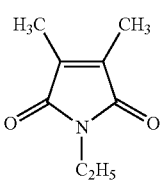

3-4-dimethyl-N-ethylmaleimide
(1-ethyl-3,4-dimethyl-1H-pyrrole-2,5-dione);

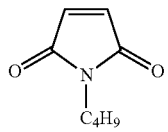
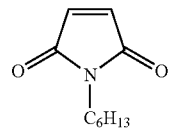

N-butylmaleimide
(1-butyl-1-1H-pyrrole-2,5-dione);

N-hexylmaleimide
(1-hexyl-1-1H-pyrrole-2,5-dione);

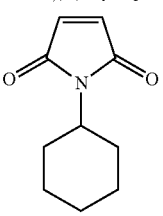

N-octylmaleimide         N-cyclopentylmaleimide
(1-octyl-1-1H-pyrrole-2,5-dione); (1-cyclopentyl-1H-pyrrole-2,5-dione);

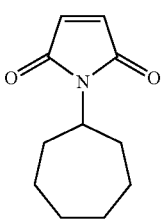

N-cyclohexylmaleimide
(1-cyclohexyl-1H-pyrrole-2,5-dione);

N-cycloheptylmaleimide
(1-cycloheptyl-1H-pyrrole-2,5-dione);

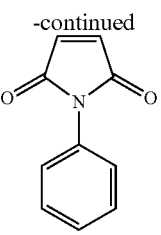

N-phenylmaleimide (1-phenyl-1H-pyrrole-2,5-dione);

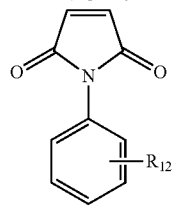

N-substituted phenylmaleimide (1-substitutedphenyl-1H-pyrrole-2,5-dione).
where $R_{12}$ = —OCOCH$_3$, methyl, ethyl, t-butyl; and

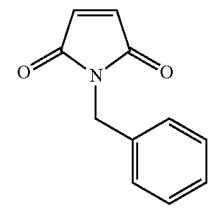

N-benzylmaleimide (1-benzyl-1H-pyrrole-2,5-dione).

In one of the embodiments, the polymer of this invention comprises one or more first repeating unit each of which is derived from a corresponding monomer selected from the group consisting of:
5-hexylbicyclo[2.2.1]hept-2-ene;
5-octylbicyclo[2.2.1]hept-2-ene;
5-decylbicyclo[2.2.1]hept-2-ene;
5-((2-(2-methoxyethoxy)ethoxy)methyl)bicyclo[2.2.1]hept-2-ene;
1-(bicyclo[2.2.1]hept-5-en-2-yl)-2,5,8,11-tetraoxadodecane;
5-benzylbicyclo[2.2.1]hept-2-ene; and
5-phenethylbicyclo[2.2.1]hept-2-ene.

In yet another embodiment, the polymer of this invention comprises one or more second repeating unit each of which is derived from a corresponding monomer selected from the group consisting of:
maleic anhydride;
2-methyl-maleic anhydride (3-methylfuran-2,5-dione);
2,3-dimethyl-maleic anhydride (3,4-dimethylfuran-2,5-dione);
2-ethyl-maleic anhydride (3-ethylfuran-2,5-dione);
2,3-diethyl-maleic anhydride (3,4-diethylfuran-2,5-dione);
2-trifluoromethyl-maleic anhydride (3-trifluoromethylfuran-2,5-dione);
2,3-bis(trifluoromethyl)-maleic anhydride (3,4-bis(trifluoromethyl)furan-2,5-dione); and
2-methyl-3-trifluoromethyl-maleic anhydride (3-methyl-4-(trifluoromethyl)furan-2,5-dione).

In yet another embodiment, the polymer of this invention comprises one or more third repeating unit each of which is derived from a corresponding monomer selected from the group consisting of:
N-ethylmaleimide (1-ethyl-1H-pyrrole-2,5-dione);
N-butylmaleimide (1-butyl-1H-pyrrole-2,5-dione);
N-hexylmaleimide (1-hexyl-1H-pyrrole-2,5-dione);

N-octylmaleimide (1-octyl-1H-pyrrole-2,5-dione);
N-cyclopentylmaleimide (1-cyclopentyl-1H-pyrrole-2,5-dione);
N-cyclohexylmaleimide (1-cyclohexyl-1H-pyrrole-2,5-dione);
N-cycloheptylmaleimide (1-cycloheptyl-1H-pyrrole-2,5-dione);
N-phenylmaleimide (1-phenyl-1H-pyrrole-2,5-dione); and
N-benzylmaleimide (1-benzyl-1H-pyrrole-2,5-dione);

In yet another embodiment, the polymer of this invention comprises one or more first repeat units each of which is derived from the corresponding monomer selected from:
5-octylbicyclo[2.2.1]hept-2-ene (OctNB);
5-decylbicyclo[2.2.1]hept-2-ene (DecNB);
5-((2-(2-methoxyethoxy)ethoxy)methyl)bicyclo[2.2.1]hept-2-ene (NBTON);
1-(bicyclo[2.2.1]hept-5-en-2-yl)-2,5,8,11-tetraoxadodecane (NBTODD); and
5-phenethylbicyclo[2.2.1]hept-2-ene (PENB).

In this aspect of the invention, the second repeat unit of this embodiment is derived from maleic anhydride. Further, the third repeat unit in this embodiment of the invention is derived from:
N-hexylmaleimide (1-hexyl-1H-pyrrole-2,5-dione);
N-cyclohexylmaleimide (1-cyclohexyl-1H-pyrrole-2,5-dione); and
N-phenylmaleimide (1-phenyl-1H-pyrrole-2,5-dione).

In yet another embodiment, the polymer of this invention comprises one or more first repeat units each of which is derived from the corresponding monomer selected from:
5-decylbicyclo[2.2.1]hept-2-ene (DecNB);
5-((2-(2-methoxyethoxy)ethoxy)methyl)bicyclo[2.2.1]hept-2-ene (NBTON); and
5-phenethylbicyclo[2.2.1]hept-2-ene (PENB).

In this aspect of the invention, the second repeat unit of this embodiment is derived from maleic anhydride. Further, the third repeat unit in this embodiment of the invention is derived from:
N-hexylmaleimide (1-hexyl-1H-pyrrole-2,5-dione);
N-cyclohexylmaleimide (1-cyclohexyl-1H-pyrrole-2,5-dione); and
N-phenylmaleimide (1-phenyl-1H-pyrrole-2,5-dione).

Polymer Preparation

In general, the polymers of this invention can be prepared by any one of the known procedures in the art. For instance, one or more monomers of formula (I) as described herein can be polymerized along with at least one monomer of formula (II) and at least one monomer of formula (III) to form the polymers of this invention containing the respective monomeric repeat units as represented by formula (IA), (IIB) and (IIIA) which are called hereinafter as "COMA-MI" polymers (copolymers of maleic anhydride and maleimide). The maleic anhydride repeat units of formula (IIB) are subsequently ring opened either partially or completely by subjecting to suitable reaction conditions to form repeat units of formula (IIA) as described herein, which are called hereinafter as "ROMA-MI" polymers (ring opened maleic anhydride and maleimide polymers). Again, any of the polymerization methods can be employed to form the polymers of this invention. In general, the polymerization can be carried out either in solution using a desirable solvent or in mass, and in both instances, suitably in the presence of a catalyst or an initiator. Any of the known catalyst system which brings about the polymerization of the monomers of formula (I) with monomers of formulae (II) and (III) can be used.

Advantageously, it has now been found that polymers of this invention can be prepared by any of the known free radical polymerization procedures. Typically in a free radical polymerization process, the monomers are polymerized in a solvent at an elevated temperature (about 50° C. to about 150° C.) in the presence of a free radical initiator. However, in certain situations ambient or sub-ambient temperatures can be employed depending upon the types of monomers employed as well as the initiators used. Suitable initiators include but are not limited to azo compounds and peroxides. Non-limiting examples of azo compounds include azobisisobutyronitrile (AIBN), (E)-dimethyl 2,2'-(diazene-1,2-diyl)bis(2-methylpropanoate) (AMMP), (E)-2,2'-(diazene-1,2-diyl)bis(2,4-dimethylpentanenitrile) (ADMPN), 1,1'-azobis(cyclohexanecarbonitrile) (ABCN), azobisisocapronitrile and azobisisovaleronitrile. Non-limiting examples of peroxides include hydrogen peroxide, tert-butylhydroperoxide, di-(tertiary)-butyl peroxide, benzoyl peroxide, lauryl peroxide, and methyl ethyl ketone peroxide. As noted, any of the other known initiators, including other azo compounds and peroxides can also be used in this polymerization process.

Suitable polymerization solvents for the aforementioned free radical polymerization reactions include hydrocarbon, haloalkane and aromatic solvents. Exemplary hydrocarbon solvents include but are not limited to alkanes and cycloalkanes such as pentane, hexane, heptane and cyclohexane. Exemplary haloalkane solvents include but or not limited to dichloromethane, chloroform, carbon tetrachloride, ethylchloride, 1,1-dichloroethane, 1,2-dichloroethane, 1-chloropropane, 2-chloropropane, 1-chlorobutane, 2-chlorobutane, 1-chloro-2-methylpropane, 1-chloropentane, Freon™ 112 halocarbon solvent. Exemplary aromatic solvents include but are not limited to benzene, toluene, xylene, mesitylene, chlorobenzene, and o-dichlorobenzene. Other organic solvents such as diethyl ether, tetrahydrofuran, acetates (e.g., ethyl acetate) and other esters, lactones, ketones (e.g., methyl ethyl ketone (MEK)) and amides are also useful. Mixtures of one or more of the foregoing solvents can be utilized as a polymerization solvent. In some embodiments the solvents employed include cyclohexane, toluene, mesitylene, dichloromethane and 1,2-dichloroethane.

Advantageously, as noted above, it has now been found that the polymers of this invention feature an alternating sequence of first type of repeat units of formula (IA) with one of maleic anhydride of formula (IIB) or a maleimide of formula (IIIA), particularly if the polymer is made by a free radical polymerization as described herein. Thus, the polymers of this invention generally incorporate repeating units of formula (IA) from about 40 mole percent to about 60 mole percent. The remaining repeat units are being derived from a combination of repeat units of formulae (IIB) and (IIIA). Accordingly, in some embodiments the molar ratio of repeat units of formulae (IA):(IIB):(IIIA) can be 40:30:30, 40:40:20, 50:20:30, 50:25:25, 50:30:20, 50:40:10, 50:45:5, 60:20:20, and the like.

Again, as noted above, one or more distinct types of repeat units of formula (IA) may be present in the polymer of this invention. Accordingly, in one of the embodiments the polymer of this invention contains only one type of repeat unit of formula (IA). In another embodiment, the polymer of this invention contains two distinctive types of repeat units of formula (IA). In other embodiments the polymer of this invention contains more than two distinctive types of repeat units of formula (IA). Similarly, various different types of repeat units of formulae (IIB) and (IIIA) can be used to form the polymers of this invention.

As noted, the polymer as obtained above is then subjected to suitable reaction conditions to ring open the maleic anhydride repeat units of formula (IIB). Any of the known methods which would bring about such a ring opening can be employed in this method of the invention. Non-limiting examples of such ring opening reactions include reacting the polymer with a suitable alcohol optionally in the presence of a suitable base or an acid. Non-limiting examples of alcohols include methanol, ethanol, n-propanol, iso-propanol, n-butanol, iso-butanol, tert-butanol, pentanol, hexanol, octanol, fluoroalkanoyl, methoxyethanol, methoxyethoxymethanol, methoxyethoxyethanol, and the like. Non-limiting examples of base include sodium hydroxide, lithium hydroxide, potassium hydroxide, cesium hydroxide, ammonia, ammonium hydroxide, magnesium hydroxide, calcium hydroxide, barium hydroxide, and the like. Various other known organic bases can also be employed. Representative examples of which include, tetramethylammonium hydroxide (TMAH), tetraethylammonium hydroxide (TEAH), pyridine, imidazole, and the like. Non-limiting examples of acids include acetic acid, trifluoroacetic acid, sulfuric acid, hydrochloric acid, methanesulfonic acid, trifluoromethanesulfonic acid, p-toluenesulfonic acid, benzenesulfonic acid, and mixtures thereof. As noted, in some embodiments the ring opening can also be carried without any acid or base.

The aforementioned ring opening reactions can be carried out using any of the known methods in the art. Typically, such reactions are carried out in a suitable solvent or a mixture of solvents in the presence of a base and an alcohol. Examples of base and alcohol are already described above. Non-limiting examples of solvents include tetrahydrofuran (THF), acetonitrile, dimethylacetamide (DMAc), dimethyl sulfoxide (DMSO), N-methylpyrrolidone (NMP), propyleneglycol monomethylether acetate (PGMEA), ethyl acetate, methyl ethyl ketone (MEK), toluene, hexane, water, and mixtures in any combination thereof. The reaction can be carried out at suitable temperature including ambient, sub-ambient and super-ambient conditions. Typically, the reaction temperature employed is in the range of about 40 to 90° C. and in certain embodiments the temperature can be in the range of 50 to 80° C. and in some other embodiments it can be in the range of 60 to 70° C.

The ROMA-MI polymers so formed in accordance with this invention, depending upon contacting with such aforementioned reagents will cause either complete or partial ring open of the maleic anhydride repeating units to form a repeat unit of formula (IIA). Thus, such ROMA polymers may have a randomly ordered repeat units of formula (IA), (IIA) and (IIB), as well as repeat units of formula (IIIA), wherein the repeat units of formula (IIA) may include a combination of diacid (i.e., both $R_7$ and $R_8$ are hydrogen), monoester (i.e., one of $R_7$ and $R_8$ is hydrogen) or a diester (i.e., both $R_7$ and $R_8$ are alkyl, and the like) depending upon the degree of esterification with the alcohol. Thus in accordance with this aspect of the embodiment of this invention, the ring opened portion of the maleic anhydride repeat unit of formula (IIA) is in the order of from about 1 mole percent to about 100 mole percent; in some other embodiments it is higher than 40 mole percent; in some other embodiments it is higher than 60 mole percent; and in some other embodiments it is higher than 80 mole percent. In some other embodiments more than 90 mole percent of maleic anhydride units are ring opened where one of $R_7$ and $R_8$ is hydrogen. That is, the polymer in these embodiments encompasses maleic anhydride repeat units of formula (IIA) where one of $R_7$ and $R_8$ is hydrogen. Accordingly, the ring opened maleic anhydride repeat unit may be partially hydrolyzed to mono-carboxylic acid (i.e., one of $R_7$ and $R_8$ is hydrogen) or fully hydrolyzed to di-carboxylic acid (i.e., both $R_7$ and $R_8$ are hydrogen). The amount of free acid present can be tailored by controlling the degree of esterification with an alcohol. Thus in one of the embodiments the amount of diacid present in the maleic anhydride repeat units of formula (IIA) is from about 0 mole percent to about 100 mole percent; in some other embodiments it is from about 20 mole percent to about 80 mole percent; in some other embodiments it is from about 40 mole percent to about 60 mole percent; and in some other embodiments it is from about 45 mole percent to about 55 mole percent. That is to say, when 50 mole percent of the repeat unit of formula (IIA) is diacid, the remaining portions of the repeat units are esterified, thus portions of the repeat units may be mono-esterified or di-esterified to give a cumulative total of 50% of the repeat units to be esterified.

The COMA-MI and ROMA-MI polymers formed according to this invention generally exhibit a weight average molecular weight ($M_w$) of at least about 2,000. In another embodiment, the polymer of this invention has a $M_w$ of at least about 6,000. In yet another embodiment, the polymer of this invention has a $M_w$ of at least about 10,000. In some other embodiments, the polymer of this invention has a $M_w$ of at least about 25,000. In some other embodiments, the polymer of this invention has a $M_w$ higher than 25,000. The weight average molecular weight ($M_w$) of the polymer can be determined by any of the known techniques, such as for example, by gel permeation chromatography (GPC) equipped with suitable detector and calibration standards, such as differential refractive index detector calibrated with narrow-distribution polystyrene standards.

Polymer Compositions/Applications

As mentioned above, embodiments in accordance with the present invention are also directed to various layer forming photosensitive polymer compositions containing polymers encompassing one or more norbornene-type repeating units of formula (IA), one or more maleic-anhydride type repeating units of formula (IIB) (COMA-MI), and partially or completely ring opened maleic anhydride type repeat units of formula (IIA) (ROMA-MI) resulting therefrom as described hereinabove and hereafter, and one or more maleimide type repeat units of formula (IIIA). Such polymer compositions may further contain a photo active compound (PAC), an epoxy resin and a solvent. Further, such compositions are capable of forming films useful as self-imageable layers in the manufacture of microelectronic and optoelectronic devices. That is to say that when imagewise exposed to actinic radiation, such layers (or films) can be developed to form a patterned film, where such pattern is reflective of the image through which the film was exposed.

In this manner, structures can be provided that are, or are to become, a part of such microelectronic and/or optoelectronic devices. For example, such films may be useful as low-K dielectric layers in liquid crystal displays or in microelectronic devices. It will be noted that such examples are only a few of the many uses for such a self-imageable film, and such examples do not serve to limit the scope of such films or the polymers and polymer compositions that are used to form them.

Advantageously, it has now been found that polymer compositions of this invention provide several desirable properties especially when compared to several of the polymers reported in the literature for similar applications. For instance, it has been observed that several of the styrene-maleic anhydride copolymers exhibit very high dark field loss (DFL) making them less desirable for positive tone (PT) applications. As used herein, the term DFL or the unexposed area film thickness loss is a measure of the film thickness loss after image-wise exposure to suitable actinic radiation and developing in a suitable developer. That is, the polymer compositions of this invention are cast into films, the film thicknesses before and after development in an unexposed region of the film are measured and reported as percent loss of the film thickness in areas of the film that was not exposed to the radiation. Generally, higher the percent of DFL, poorer the performance of the polymer composition, which means that the unexposed areas of the film are more susceptible to the developed and thus dissolves in the developer. In addition, the measured DFL also depends on the developed time employed. Generally, longer the develop time higher the DFL.

Surprisingly, the compositions of this invention exhibit very low DFL in that the unexposed area of the film is not lost even at shorter develop time. Accordingly, in some embodiments of this invention the DFL of the compositions may be less than about 20 percent; in some other embodiments DFL can be less than 25 percent; and in some other embodiments the DFL may be in the range of from about 0 percent to 30 percent. At the same time the develop time for the compositions of this invention can generally range from about 10 seconds to about 80 seconds; in some other embodiments the develop time can range from about 20 seconds to about 60 seconds; and in some other embodiments the develop time can range from about 30 seconds to about 40 seconds.

In addition, advantageously it has also been found that the compositions of this invention exhibit excellent dissolution rate in the developing solvent, such as for example, aqueous based alkali developer, including tetramethylammonium hydroxide (TMAH). This can be further be tailored based on the molar content of maleimide repeat units in the polymer. Generally, it has now been found that by judicious selection of the molar ratio of ring opened maleic anhydride repeat units and the maleimide repeat units it is now possible to control the dissolution rate of the composition of this invention to the desirable range. Generally, increasing the molar amounts of maleimide repeat units results in lower dissolution rates, while improving the thermal reflow properties, which aspect becomes more important during downstream operations after developing the films. Furthermore, the compositions of this invention retain much needed lithographic resolution, photospeed and high degree of chemical resistance, among various other desirable properties.

In addition, the compositions of this invention contain one or more photoactive compounds (PACs). Generally, any PAC which can bring about the desirable effect in a positive tone composition can be employed herein. Non-limiting examples of suitable photoactive compounds (PACs) that can be employed in these photosensitive compositions encompasses a photoactive group, such as 1,2-naphthoquinonediazide-5-sulfonyl moiety and/or a 1,2-naphthoquinonediazide-4-sulfonyl moiety as represented by structural formulae (VIIa) and (VIIb), respectively:

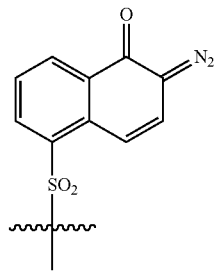

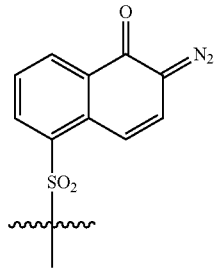

Other such photoactive moieties, among others, include sulfonyl benzoquinone diazide group represented by structural formula (VIIc):

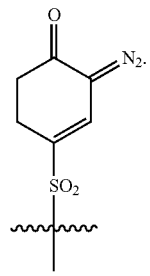

Generally, the functional groups of formulae (VIIa), (VIIb) and/or (VIIc) are incorporated into the photosensitive composition as an esterification product of the respective sulfonyl chloride (or other reactive moiety) and a phenolic compound, such as one or more of the exemplary compounds represented below collectively as structural formulae (VIIIa) to (VIIIag). Thus, any one, or any mixture of two or more of such esterification products are combined with the resin in forming the photosensitive resin compositions of the present invention. In the formulae (VIII) below, Q may represent any of the structures (VIIa), (VIIb) or (VIIc). Advantageously, when a portion of a film or a layer of the photosensitive composition is exposed to appropriate electromagnetic radiation, these esterification products generate a carboxylic acid which enhances the solubility of such exposed portion in an aqueous alkali solution as compared to any unexposed portions of such film. Generally, such photosensitive materials are incorporated into the composition in an amount from 1 to 50 parts by weight material to 100 parts by weight resin, i.e., the polymer of this invention; and typically from about 2 to about 30 parts by weight. Where the specific ratio of the photosensitive material to resin is a function of the dissolution rate of exposed portions as compared to unexposed portions and the amount of radiation required to achieve a desired dissolution rate differential.

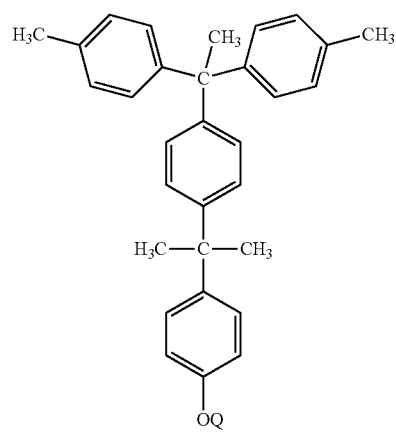
(VIIIa)
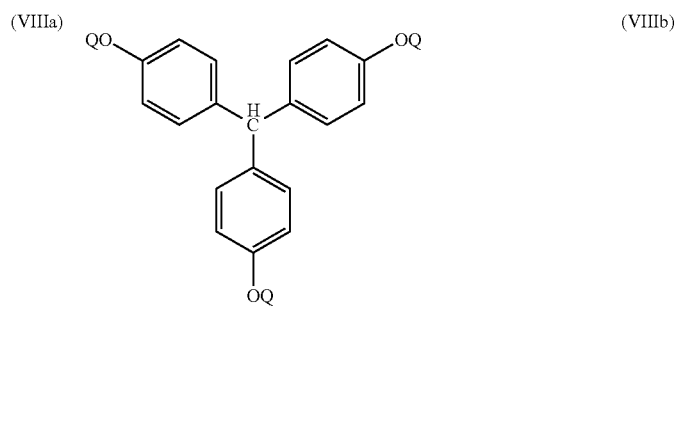
(VIIIb)
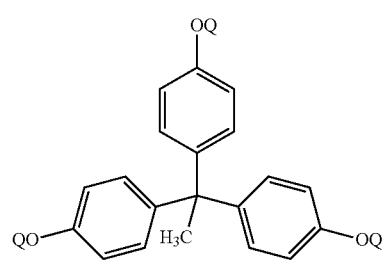
(VIIIc)
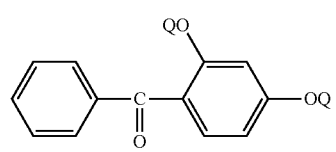
(VIIId)
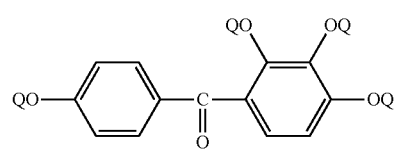
(VIIIe)
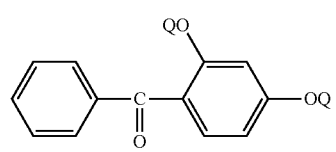
(VIIIf)
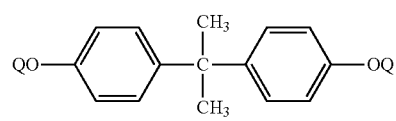
(VIIIg)
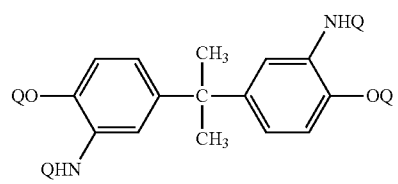
(VIIIh)
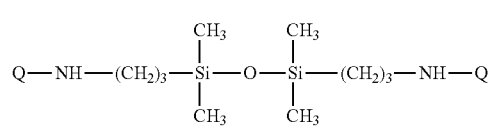
(VIIIi)
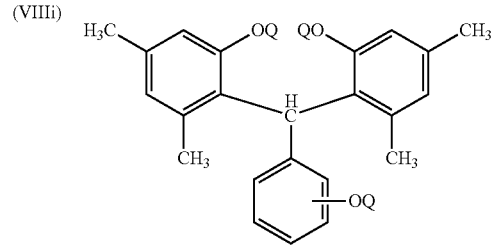
(VIIIj)

-continued
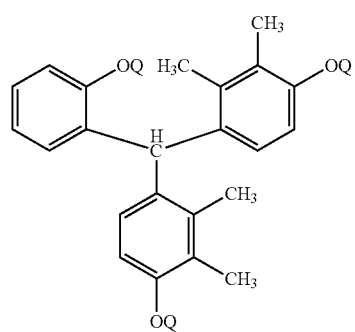 (VIIIk)
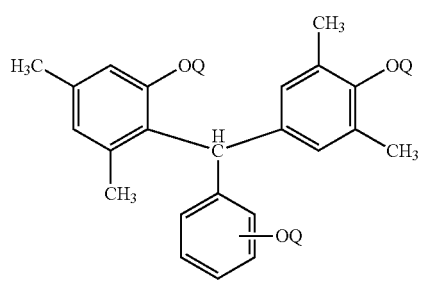 (VIIIl)
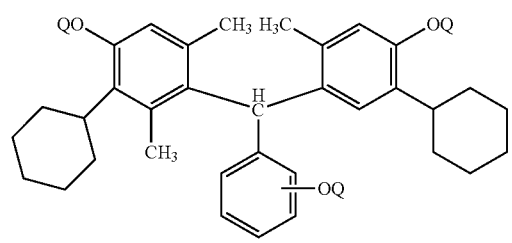 (VIIIm)
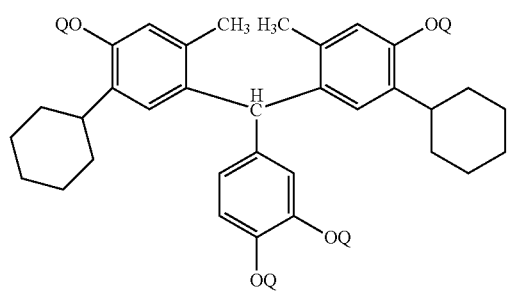 (VIIIn)
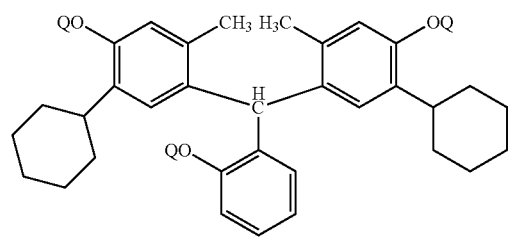 (VIIIo)
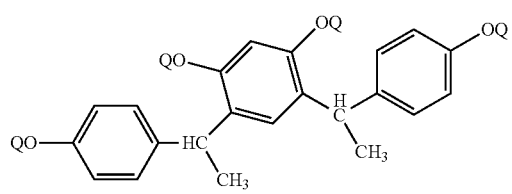 (VIIIp)
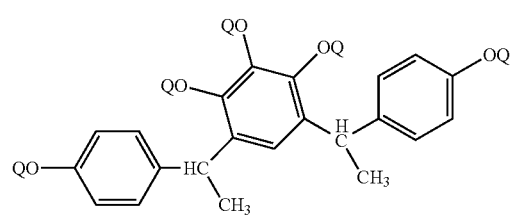 (VIIIq)
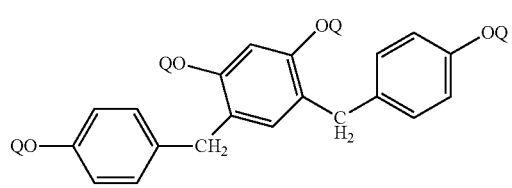 (VIIIr)
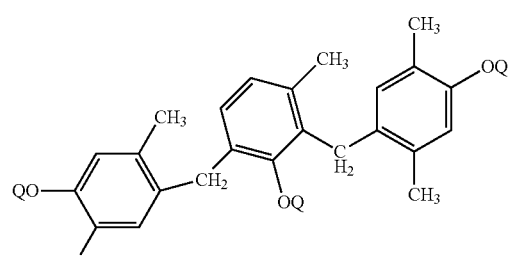 (VIIIs)
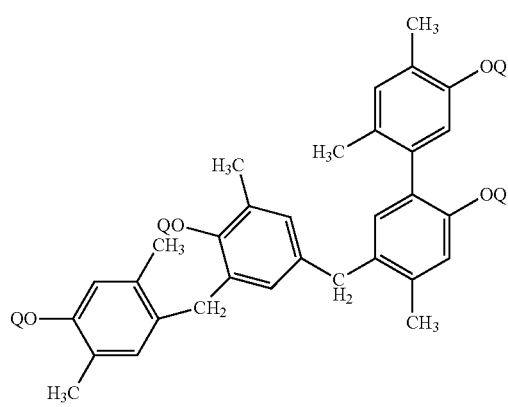 (VIIIt)

-continued
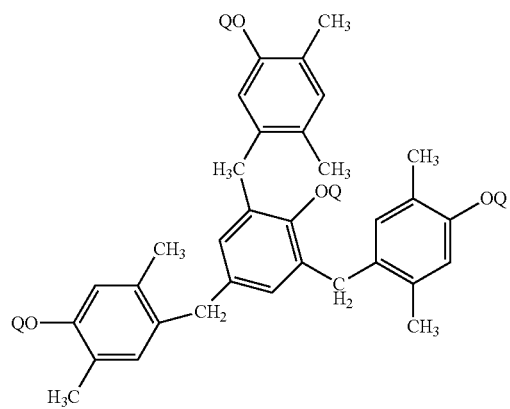
(VIIIu)
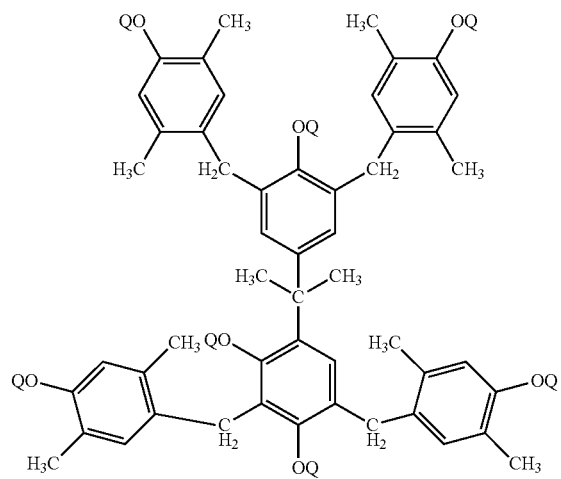
(VIIIv)
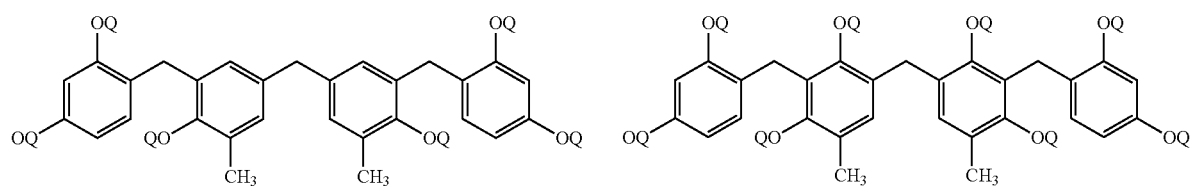
(VIIIw) (VIIIx)
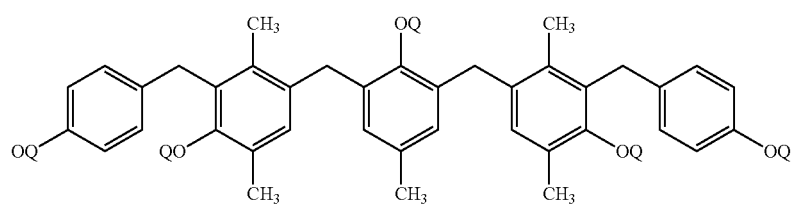
(VIIIy)
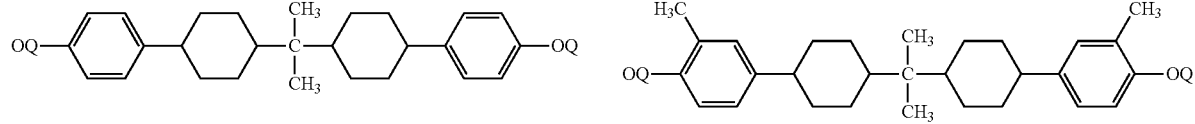
(VIIIz) (VIIIaa)
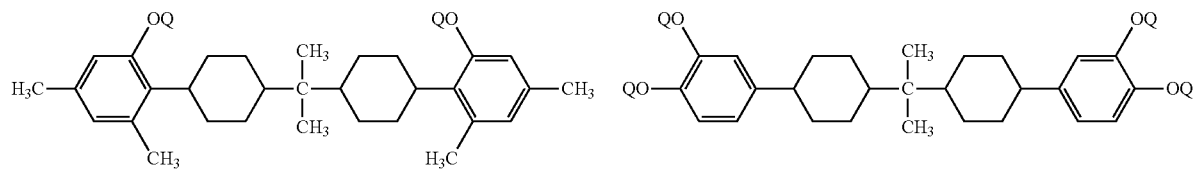
(VIIIab) (VIIIac)
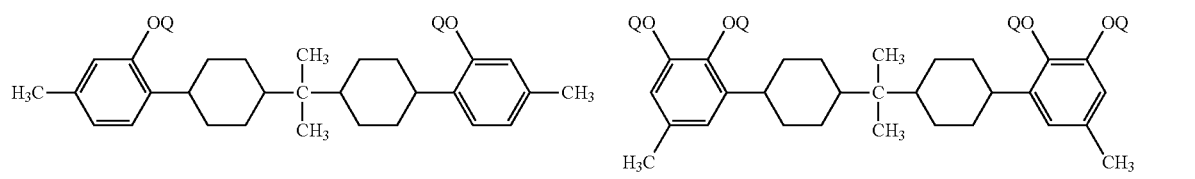
(VIIIad) (VIIIae)

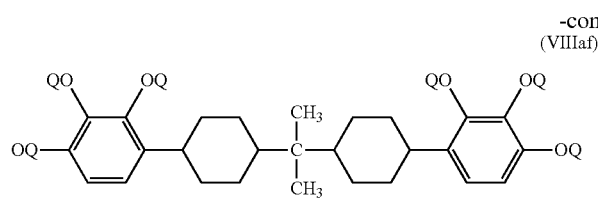 (VIIIaf)

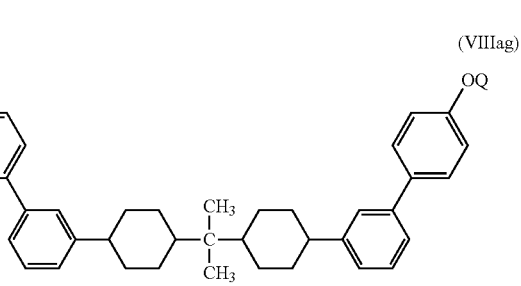 (VIIIag)

In the above listed PACs of formulae (VIIIa) to (VIIIag), Q refers to any one of photoactive moieties of formulae (VIIa), (VIIb) or (VIIc). Several of the PACs listed above are commercially available. For example, PAC-5570 of formula (VIIIc) (St. Jean Photochemicals Inc., Quebec, Canada), SCL6 of formula (VIIId) (Secant Chemicals Inc., Winchendon, Mass., USA), TrisP-3M6C-2-201 of formula (VIIIo) (also referred to herein as TrisP), collectively TS-200, TS-250 and TS-300 of formula (VIIIa), and 4NT-300 of formula (VIIIe) (all from Toyo Gosei Co. Ltd., Chiba, Japan). It should be noted that for PACs of the types TS-200, TS-250 and TS-300, the degree of substitution of Qs also varies based on the product used. For instance, TS-200 is substituted with 67% of Q, TS-250 is substituted with 83% of Q, and TS-300 with 100% of Q, the unsubstituted portion being hydrogen. Again, Q in each of these instances refers to one of group (VIIa), (VIIb) or (VIIc).

Exemplary epoxies and other cross-linking additives, as mentioned above, include, but are not limited to, bisphenol A epoxy resin (LX-01—where n=1 to 2, Daiso Chemical Co., Osaka, Japan), 2,2'-((((1-(4-(2-(4-(oxiran-2-ylmethoxy)phenyl)propan-2-yl)phenyl)ethane-1,1-diyl)bis(4,1-phenylene))bis(oxy))bis(methylene))bis(oxirane) (Techmore VG3101L—Mitsui Chemical Inc.), trimethylolpropane triglycidylether (TMPTGE—CVC Specialty Chemicals, Inc.), 1,1,3,3,5,5-hexamethyl-1,5-bis(3-(oxiran-2-ylmethoxy)propyl)trisiloxane (DMS-E09—Gelest, Inc.), liquid epoxy resins (D.E.R.™ 732, where n=8 to 10, and D.E.R.™ 736, where n=4 to 6—both from Dow Chemical Company), bis(4-(oxiran-2-ylmethoxy)phenyl)methane (EPON™ 862, Hexion Specialty Chemicals, Inc.), triglycidyl ether of poly (oxypropylene)epoxide ether of glycerol (commercially available as Heloxy 84 or GE-36 from Momentive Specialty Chemicals Inc.), 2-((4-(tert-butyl)phenoxy)methyl)oxirane (commercially available as Heloxy 65 from Momentive Specialty Chemicals Inc.) and silicone modified epoxy compound (commercially available as BY16-115 from Toray-Dow Corning Silicone Co., Ltd.) as shown below:

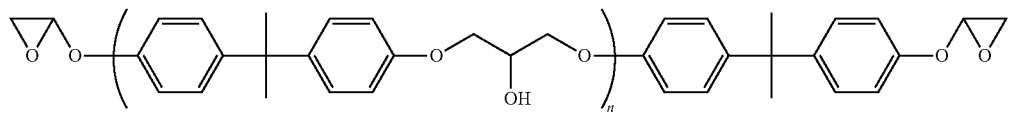
LX-01

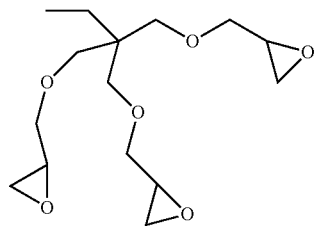
TMPTGE

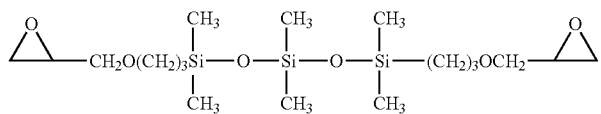
DMS-E09

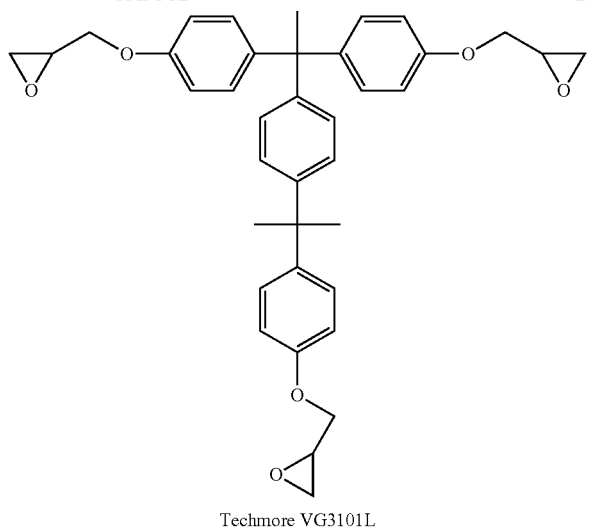
Techmore VG3101L

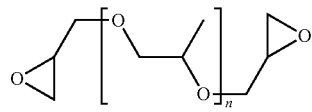

D.E.R.™ 732, where n=8 to 10 and D.E.R.™ 736, where n=4 to 6

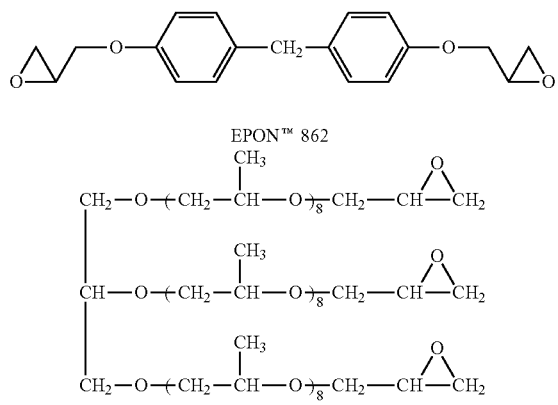

triglycidyl ether of poly(oxypropylene)epoxide ether of glycerol, commercially available as Heloxy 84 or GE-36 from Momentive Specialty Chemicals Inc.;

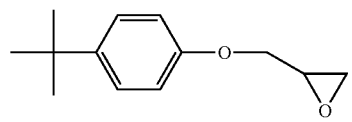

2-((4-(tert-buty phenoxy)methyl)oxirane, commercially available as Heloxy 65 from Momentive Specialty Chemicals Inc.; and

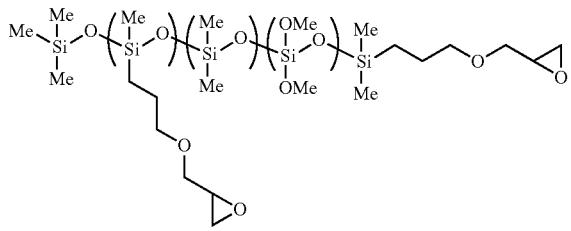

Silicone modified epoxy compound commercially available as BY16-115 from Toray-Dow Corning Silicone Co., Ltd.

Still other exemplary epoxy resins or cross-linking additives include, among others Araldite MTO163 and Araldite CY179 (manufactured by Ciba Geigy); and EHPE-3150, Epolite GT300 and (manufactured by Daicel Chemical).

The amount of epoxy compound may also vary as noted for PACs. The amount can vary generally from about 0 to 50 parts by weight of the polymer and typically from about 2 to about 30 parts by weight, although other advantageous amounts of such materials are also appropriate and within the scope of the present invention. In addition, one or more different types of epoxy compounds as enumerated herein can be used in the composition of this invention and the amounts of each can thus be varied as needed.

Advantageously, it has now been found that judicious selection of the epoxy compound in the compositions of this invention may offer certain unexpected benefits. For instance, it has now been found that epoxy compounds having certain desirable epoxy equivalent weight and Log P offers certain surprising benefits. As used herein "Log P" is a measure of the partition-coefficient (P), that is, the ratio of concentrations of a compound in a mixture of two immiscible phases at equilibrium (water and 1-octanol). Generally, lower the Log P value higher the miscibility of such an epoxy compound in water. Such benefits include, among other things, improved DFL properties and thermal reflow properties. These features become more apparent from the specific examples that follow. It should further be noted that various benefits obtained from this invention depends on many factors as already described herein and some of which may be readily appreciated by one of skill in the art. Accordingly, in some embodiments the photosensitive compositions of this invention contains an epoxy compound having an epoxy equivalent weight higher than about 200. In other embodiments such epoxy equivalent weight may range from about 200 to 400 or higher. Further, Log P values of such epoxy compounds may be in the range of from about −0.3 to about −0.8; in other embodiments such Log P values are from about −0.4 to about −0.6. In some embodiments the epoxy compound is having an equivalent weight of about 300 to 400 and Log P of about −0.3 to −0.4.

It will be understood that exemplary embodiments of the present invention, can include other suitable components and/or materials such as are necessary for formulating and using the polymer compositions in accordance with the present invention. Such other suitable components and/or materials include one or more components selected from sensitizer components, solvents, catalyst scavengers, adhesion promoters, stabilizers, and reactive diluents.

The polymer compositions in accordance with the present invention may further contain optional components as may be useful for the purpose of improving properties of both the composition and the resulting layer, for example the sensitivity of the composition to a desired wavelength of exposure radiation. Examples of such optional components include various additives such as a dissolution promoter, a surfactant, a silane coupling agent, a leveling agent, an antioxidant, a fire retardant, a plasticizer, a crosslinking agent or the like. Such additives include, but are not limited to, bisphenol A and 5-norbornene-2,3-dicarboxylic acid as a dissolution promoter, a silicone surfactant such as TSF4452 (Toshiba Silicone Co., Ltd), a silane coupling agent such as γ-aminopropyl triethoxysilane, a leveling agent, such as γ-(methacryloyloxy propyl) trimethoxysilane, antioxidants such as pentaerythritol tetrakis(3-(3,5-di-tert-butyl-4-hydroxyphenyl)propionate) (IRGANOX™ 1010 from BASF), 3,5-bis(1,1-dimethylethyl)-4-hydroxy-octadecyl ester benzenepropanoic acid (IRGANOX™ 1076 from BASF) and thiodiethylene bis[3-(3,5-di-tert.-butyl-4-hydroxy-phenyl) propionate] (IRGANOX™ 1035 from BASF), a fire retardant such as a trialkyl phosphate or other organic phosphoric compound and a plasticizer such as, poly(propylene glycol).

In addition, various other additives/components can be added to the composition of this invention, which is used for the formation of the photoimageable layer such that its mechanical and other properties can be tailored as desired. Also, other additives can be used to alter the processability, which include increase the stability of the polymer to thermal and/or light radiation. In this regard, the additives can include, but are not limited to, crosslinking agents, adhesion promoters, and the like. Non-limiting examples of such compounds are selected from the group consisting of the following, commercially available materials are indicated by such commercial names.

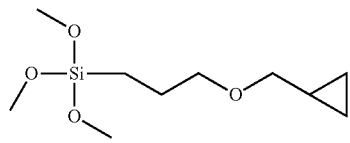

trimethoxy(3-(oxiran-2-ylmethoxy)propyl)silane, also commonly known as 3-glycidoxypropyl trimethoxysilane (KBM-403E from Shin-Etsu Chemical Co., Ltd.);

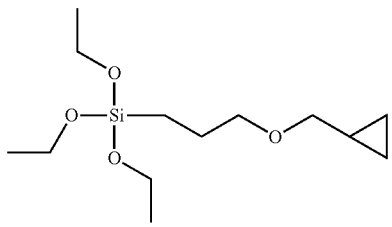 [SMILES: CCO[Si](CCCOCC1CC1)(OCC)OCC]

triethoxy(3-(oxiran-2-ylmethoxy)propyl)silane, also commonly known as 3-glycidoxypropyl triethoxysilane (KBE-403 from Shin-Etsu Chemical Co., Ltd.);

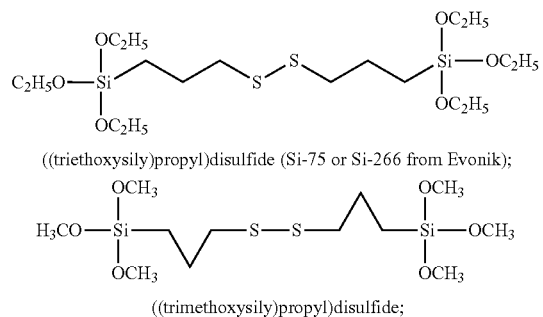

((triethoxysily)propyl)disulfide (Si-75 or Si-266 from Evonik);

((trimethoxysily)propyl)disulfide;

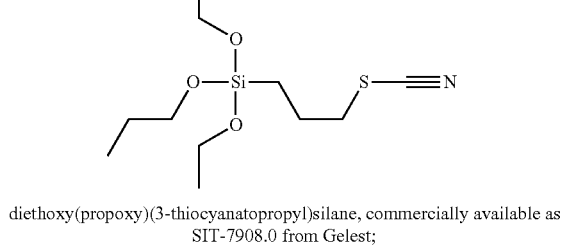

diethoxy(propoxy)(3-thiocyanatopropyl)silane, commercially available as SIT-7908.0 from Gelest;

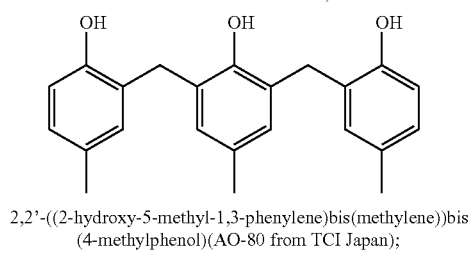

2,2'-((2-hydroxy-5-methyl-1,3-phenylene)bis(methylene))bis (4-methylphenol)(AO-80 from TCI Japan);

-continued

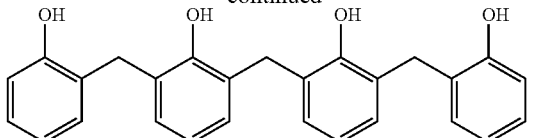

6,6'-methylenebis(2-(2-hydroxy-5-methylbenxyl)-4-methylphenol) (4-PC);

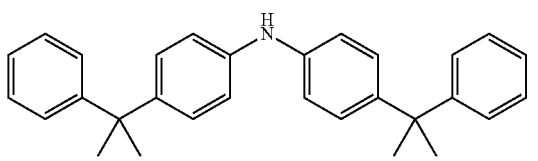

bis(4-(2-phenylpropan-2-yl)phenyl)amine, commercially available as Naugard-445 from Addivant;

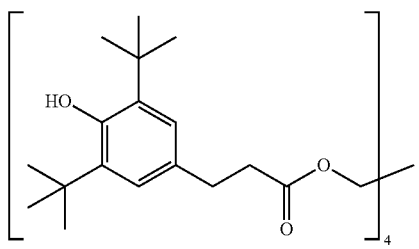

pentaerythritol tetrakis(3-(3-5-di-tert-butyl-4-hydroxyphenyl)propionate) (Irganox 1010 from BASF);

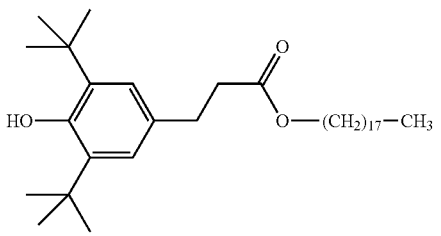

3,5-bis(1,1-dimethylethyl)-4-hydroxy-octadecyl ester benzenepropanoic acid (Irganox 1076 from BASF); and

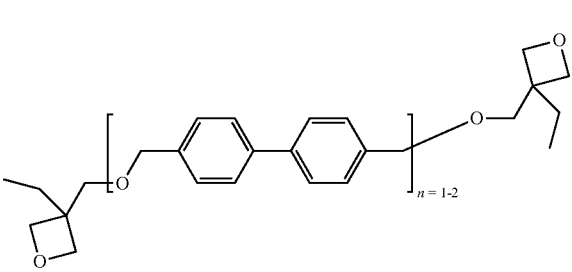

3,3'-[[1,1'-biphenyl]-4, 4'-diylbis(methyleneoxymethylene)]bis[3-ethyl-oxetane

Advantageously, it has further been found that certain of the thermal base generators (TBGs) are useful in the photosensitive composition of this invention especially during the thermal curing stage as described herein. Some examples of such thermal base generators include amidine compounds of the formula (IX):

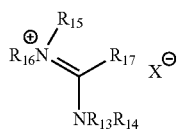

(IX)

Where each $R_{16}$ is independently selected from hydrogen or $(C_1$-$C_6)$alkyl;

$R_{13}$, $R_{14}$ and $R_{17}$ are the same or different and each independently of one another is selected from hydrogen, a methyl or ethyl group, a linear, branched or cyclic $(C_3$-$C_{12})$ alkyl group; a linear, branched or cyclic $(C_3$-$C_{12})$heteroalkyl group having from 1 to 4 heteroatoms independently selected from nitrogen, oxygen or sulfur; a $(C_6$-$C_{10})$aryl group; a $(C_5$-$C_{10})$heteroaryl group having from 1 to 4 heteroatoms independently selected from nitrogen, oxygen or sulfur; or where $R_{16}$, $R_{17}$, $R_{13}$ and $R_{14}$ taken together with any intervening atoms and in any combination thereof form one or more cyclic alkyl or heteroalkyl groups;

$R_{15}$ is hydrogen or $(C_1$-$C_6)$alkyl; and $X^\ominus$ is halide, sulfonate, methanesulfonate, trifluoromethanesulfonate or a carboxylate anion.

A proprietary amidine salt, K-PURE® CXC-1761, is available from King Industries, was also evaluated as a TBG as further discussed hereinbelow in the specific examples. A few of the thermally activated base generators in accordance with the present invention are generally salts having a carboxylate anion. Such salts being characterized by releasing a free base when heated to an effective activation temperature, the free base then having sufficient basicity to cause crosslinking of the additives with the base polymer of the composition embodiments of this invention. It should be further noted that various other examples of TBGs which are known in the literature can also be employed to form the photosensitive compositions of this invention. Such non-limiting examples of TBGs include imidazole compounds, guanidine compounds and phosphazene compounds, which form free bases upon exposure to suitable temperature at which time they cause crosslinking of the additives with the polymer encompassed by the compositions of this invention.

In the embodiments of the present invention, these components are generally dissolved in a solvent and prepared into a varnish form to be used. As a solvent, there may be used N-methyl-2-pyrrolidone (NMP), γ-butyrolactone (GBL), N,N-dimethylacetamide (DMAc), dimethylsulfoxide (DMSO), diethyleneglycol dimethylether, diethyleneglycol diethylether, diethyleneglycol dibutylether, propyleneglycol monomethylether (PGME), dipropylene glycol monomethylether, propyleneglycol monomethylether acetate (PGMEA), methyl lactate, ethyl lactate, butyl lactate, methylethyl ketone (MEK), methyl amyl ketone (MAK), cyclohexanone, tetrahydrofuran, methyl-1,3-butyleneglycolacetate, 1,3-butyleneglycol-3-monomethylether, methylpyruvate, ethyl pyruvate, methyl-3-methoxypropionate or the like. They may be used solely or mixed by optionally selecting two or more kinds and in any combination thereof.

As mentioned above, some embodiments of the present invention encompass structures, such as optoelectronic structures, which include at least one self-imageable layer formed from a film of a polymer composition embodiment in accordance with the present invention. As previously mentioned, the polymer of such a composition embodiment encompasses at least one repeating unit of formula (IA) derived from a norbornene-type monomer, at least one repeating unit of formula (IIA) or (IIB) derived from a maleic anhydride-type monomer and at least one repeating unit of formula (IIIA) derived from a maleimide-type monomer. As also noted, the polymer composition embodiment further encompasses at least one casting solvent, one or more photo active compound (PAC) as enumerated herein and one or more epoxy resin as described above.

The aforementioned structure embodiments of the present invention are readily formed by first casting a polymer composition over an appropriate substrate to form a layer thereof, then heating the substrate to an appropriate temperature for an appropriate time, where such time and temperature are sufficient to remove essentially all of the casting solvent of such composition. After such first heating, the layer is image-wise exposed to an appropriate wavelength of actinic radiation. As one of skill in the art knows, for the "positive tone" compositions, the aforementioned image-wise exposure causes the PAC contained in exposed portions of the layer to undergo a chemical reaction that enhances the dissolution rate of such exposed portions to an aqueous base solution (generally a solution of tetramethyl ammonium hydroxide (TMAH)). In this manner, such exposed portions are removed and unexposed portions remain. Next a second heating is performed to cause cross-linking of portions of the polymer with the epoxy additive, thus essentially "curing" the polymer of such unexposed portions to form an aforementioned structure embodiment of the present invention.

It should be noted again that the second heating step is performed for the imaged and developed layer. In this step of second heating, the thermal curing of the polymer layer can be achieved with the added additives, such as epoxies and/or other crosslinking agents as described herein.

The following examples, without being limiting in nature, illustrate methods for making polymer embodiments in accordance with the present invention. Such examples illustrate first forming the previously mentioned polymers, referred to herein as a cyclic olefin maleic anhydride-maleimide polymers (COMA-MI). Additionally, such examples describe forming ring-opened analogs of such COMA-MI polymers, referred to herein as ROMA-MI polymers.

It should further be noted that the following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES (GENERAL)

The following definitions have been used in the Examples that follow unless otherwise indicated:
PENB: 5-phenethylbicyclo[2.2.1]hept-2-ene; DecNB: 5-decylbicyclo[2.2.1]hept-2-ene; NBTON: 5-((2-(2-methoxyethoxy)ethoxy)methyl)bicyclo[2.2.1]hept-2-ene; MA: maleic anhydride; AIBN: azobisisobutyronitrile; THF: tetrahydrofuran; EtOAc: ethyl acetate; MeOH: methanol; NMP: N-methyl-2-pyrrolidone; PGMEA: propyleneglycol monomethylether acetate; TMPTGE: trimethylolpropane triglycidylether; COMA-MI: cyclic olefin maleic anhydride maleimide polymer; ROMA-MI: ring-opened maleic anhydride cyclic olefin maleimide polymer; Irganox 1010: pentaerythritol tetrakis(3-(3,5-di-tert-butyl-4-hydroxyphenyl) propionate); Si-75: ((triethoxysilyl)propyl)disulfide; KBM-403E: 3-glycidoxypropyl trimethoxysilane; GE-36: triglycidyl ether of poly(oxypropylene)epoxide ether of glycerol; EPON 862: bis(4-(oxiran-2-ylmethoxy)phenyl) methane; TS: total solid; HPLC: high performance liquid chromatography; GPC: gel permeation chromatography; $M_w$: weight average molecular weight; $M_n$: number average molecular weight; PDI: polydispersity index; FT-IR: Fourier transform-infrared; NMR: nuclear magnetic resonance; TGA: thermogravimetric analysis. N-cyclohexylmaleimide and N-phenylmaleimide were purchased from TCI America.

Maleimide Monomers

The following Example 1 illustrates the preparation of N-hexylmaleimide. Various other maleimide monomers as described herein can be made using this procedure and employing the appropriate starting materials.

Example 1

N-Hexylmaleimide

Into an appropriately sized vessel equipped with a thermometer, a reflux condenser with a Dean Stark Trap attachment, a nitrogen gas inlet and a mechanical stirrer were placed xylene (1600 g, Acros Organics) and maleic anhydride (176 g; Acros Organics) under nitrogen atmosphere and the temperature was increased to 40° C. The xylene solution was stirred until the solution was homogeneous. N-Hexylamine (174 g; Acros Organics) was added dropwise to the flask over a period of 30 minutes. An exothermic reaction occurred and the temperature of the reaction solution increased to 70° C. Ethyl-di-isopropylamine (10.4 g; Acros Organics), silica gel (40-60 Å; 160 g; Acros Organics), o-phosphoric acid (80 g; Fisher), zinc acetate (1.2 g; Acros Organics) and 2,6-dimethyl-4-t-butylphenol (1.2 g; Sigma-Aldrich) were added to the reaction mixture. The temperature was then increased 25 to 140° C. and the reaction mixture was refluxed for 3 hours. Water generated during the reaction was removed as an azeotrope with xylene, approximately 33.1 mL of water was collected. After three hours heating was stopped and the reactor cooled to room temperature. Stirring was stopped and the organic phase was decanted. The remaining solids were broken up and rinsed with 800 mL of xylene. The xylene was decanted and added to the recovered reaction liquor. The xylene solution was washed with 500 g of 5% sodium bicarbonate solution by stirring for 20 minutes. Stirring was stopped and after 30 minutes the organic and aqueous phases were separated and the organic phase was washed twice with 500 g of deionized water. The organic phase was separated and the xylene was removed under reduced pressure to obtain the title compound (142.4 g, 46% yield, 99% purity as determined by GC analysis).

COMA-MI Polymers

The following Example 2 illustrates the preparation of a COMA-MI polymer of this invention. Various other COMA-MI polymers of this invention can similarly be prepared using the appropriate starting materials.

Example 2

PENB/MA/N-Phenylmaleimide Polymer

In an appropriately sized reaction vessel was charged anhydrous ethyl acetate (100 g; Acros Organics), maleic anhydride (MA) (43.6 g; Acros Organics), phenethylnorbornene (PENB) (97.9 g) and N-phenylmaleimide (8.6 g). The reaction vessel was sealed, blanketed with a nitrogen atmosphere, heated to 65° C. and stirred until a homogeneous solution was obtained. The homogeneous solution was sparged with nitrogen gas for 15 minutes to remove any dissolved oxygen. 2,2'-Azobis(2-methylpropionitrile) (AIBN) (8.1 g; Sigma-Aldrich) was added to the reaction flask and the reaction solution was stirred for 17 hours. The reaction mixture was cooled to ambient temperature and diluted with ethyl acetate (EtOAc) (750 g). The reaction mixture was transferred into a 1 L separatory funnel and diluted further with heptanes (150 g) until the solution was cloudy. The title polymer was isolated by precipitating into heptanes (2 Kg) and recovering the solid by filtration. The polymer was dried under vacuum (1 torr) at 45° C. for 18 hours to obtain the title terpolymer as a light yellow solid (116.5 g, 77.6% yield). The molecular weight as determined by GPC was $M_n$=5,150; $M_w$=9,730; PDI=1.9. The molar composition of the polymer as determined by $^1$H NMR was PENB/MA/N-phenyl maleimide=48/48/4.

ROMA-MI Polymers

Example 3 illustrates a method of ring-opening the maleic anhydride repeating units of the COMA-MI polymers of Example 2 with methanol. Various other ROMA-MI polymers of this invention can similarly be prepared using the appropriate starting materials, including various other alcohols to ring open the maleic anhydride repeating unit.

Example 3

ROMA-MI Polymer of PENB/MA/N-Phenylmaleimide of Example 2

An appropriately sized reaction vessel was charged with the polymer of Example 2 (25 g) and tetrahydrofuran (THF) (75 mL; Fisher) and stirred at ambient temperature until a homogeneous solution was obtained. The reaction solution was blanketed with a nitrogen atmosphere.

In a separate vessel, sodium hydroxide (NaOH) (2.2 g; Acros Organics) and methanol (22.5 g; Fisher) were mixed at ambient temperature until a homogeneous solution was obtained. The methanolic NaOH solution was added dropwise to the above polymer solution to form a suspension of polymer salt in the reaction vessel. The solution was then stirred for 16 hours until a clear, slightly viscous reaction solution was obtained. Concentrated hydrochloric acid (HCl) (6.6 g; Fisher) was added slowly and the resulting mixture was stirred for 20 minutes. The reaction solution was transferred to a separatory funnel and allowed to separate into two phases. The denser aqueous phase was removed and the organic phase was washed twice with brine (12.5 g) and 3 times with deionized water (25 g). The organic phase was transferred to an appropriately sized round bottom flask and the organic solvents were removed under reduced pressure. The resulting crude product was dissolved in EtOAc (90 g) and toluene (10 g; Fisher) and transferred to a separatory funnel. The polymer solution was washed seven (7) times with deionized water (15 g) and then transferred to a round bottom flask and the solvents were removed under reduced pressure. The recovered solid polymer was dissolved in THF (110 g) and heptanes (15 g) and then precipitated into heptanes (250 g). The solid polymer was recovered by filtration and dried under reduced pressure at 45° C. for 18 hours (14.2 g, 87% yield, obtained as off white powder).

Figure 1B:
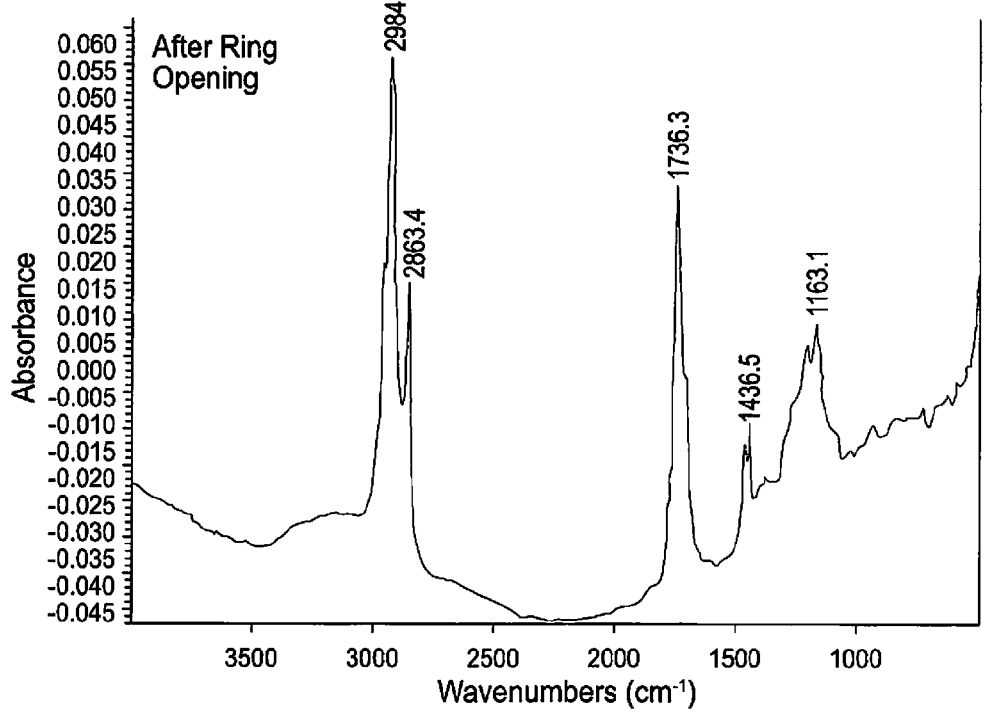

The isolated ring-opened polymer with MeOH was characterized by GPC and FT-IR. FIG. 1A shows FT-IR spectrum of the polymer of Example 2. FIG. 1B shows FT-IR spectrum of the polymer of Example 3. It is clear from these spectra that the maleic anhydride repeat units in the polymer of Example 3 are ring opened as evidenced by the disappearance of anhydride carbonyl absorption peaks at 1777 and 1857 cm$^{-1}$. Esterification ratio (% ester) was calculated by $^{13}$C NMR in DMSO-d6 by the values of integrals for —CH$_3$ of the methyl ester (—COOMe) to that of C=O for both ester (COOMe) and acid (—COOH). The degree of esterification was calculated to be 120% (i.e., $R_7$ is methyl and $R_8$ is 80% H and 20% methyl). $M_w$ and $M_n$ of the polymer was determined by GPC (THF) ($M_w$=9,900 $M_n$=5,200, PDI=1.9).

Examples 4-7

Procedures of Examples 2 and 3 were substantially repeated in Examples 4-7 with the exception of utilizing various different monomers as listed in Table 1. Also summarized in Table 1 are the feed composition of the monomers used to form the respective COMA-MI polymers in accordance with procedures of Example 2, each of which was then used to form the ROMA-MI polymers in accordance with the procedures of Example 3 using MeOH as the ring opening alcohol of the maleic anhydride repeat units. The weight average molecular weight ($M_w$), number average molecular weight ($M_n$) and the PDI of the resulting polymers were determined by GPC (THF) and are presented in Table 1 for each of these Examples. Also listed in Table 1 are the yield of the polymer obtained in each of these Examples 4-8 and the percent ring opening of the maleic anhydride repeat units.

TABLE 1

| Example No. | Feed Composition (PENB/MA/MI) | $M_w$ | $M_n$ | PDI | Ring Open (%) | Yield (%) |
|---|---|---|---|---|---|---|
| 4 | (50/45/5$^a$) | 10,500 | 5,700 | 1.8 | 95 | 78 |
| 5 | (50/45/5$^b$) | 10,400 | 5,200 | 2 | 97 | 100 |
| 6 | (50/30/20$^b$) | 12,100 | 6,900 | 1.8 | 95 | 86 |
| 7 | (50/44/6$^a$) | 10,800 | 6,100 | 1.8 | 99 | 82 |

$^a$N-phenylmaleimide;
$^b$N-hexylmaleimide

Example 8

ROMA-MI Polymer of DecNB/NBTON/MA/N-Phenylmaleimide (40/10/30/20)

Procedures of Examples 2 and 3 were substantially repeated in this Example 9 with the exception of utilizing DecNB/NBTON/MA/N-phenyl maleimide in the molar ratio of (40/10/30/20). The resulting polymer was characterized by GPC (THF): $M_w$=13,800; $M_n$=6,500; and the PDI=2.1. The percent ring opening of the maleic anhydride repeat unit was determined to be 99% and the yield of the polymer was 78%.

Comparative Example 1

ROMA Polymer of PENB/MA (50:50)

Procedures of Examples 2 and 3 were substantially repeated in this Comparative Example 1 with the exception of utilizing PENB and MA in the molar ratio of (50/50). The resulting polymer was characterized by GPC (THF): $M_w$=8,300; $M_n$=4,500; and the PDI=1.9. The percent ring opening of the maleic anhydride repeat unit was determined to be 98% and the yield of the polymer was 89%.

Comparative Example 2

ROMA Polymer of DecNB/NBTON/MA (40/10/50)

Procedures of Examples 2 and 3 were substantially repeated in this Comparative Example 2 with the exception of utilizing DecNB/NBTON/MA in the molar ratio of (40/10/50). The resulting polymer was characterized by GPC (THF): $M_w$=7,700; $M_n$=3,700; and the PDI=2.1. The percent ring opening of the maleic anhydride repeat unit was determined to be 99% and the yield of the polymer was 95%.

Examples 9-11

Photosensitive Compositions of ROMA-MI Polymers

The ROMA-MI polymer of Example 4 was formulated into various photosensitive compositions/formulations of this invention as follows: A 40 weight % solution of polymer of Example 4 in PGMEA, TrisP-3M6C-2-201, Irganox 1010, Si-75, KBM-403E, GE-36, EPON 862 and CXC-1761 as needed were mixed in an appropriately sized amber HDPE bottle. The mixture was rolled for 18 hours to produce a homogeneous solution. Particle contamination was removed by filtering through a 0.2 μm pore nylon disc filter under 35 psi pressure. The filtered polymer formulation was collected in an amber, low particle HDPE bottle and stored at 5° C. Table 2 lists various ingredients used in forming the photosensitive compositions of Examples 9-11.

TABLE 2

| Ingredients (g) | Example 9 | Example 10 | Example 11 |
|---|---|---|---|
| TrisP-3M6C-2-201 | 4.45 | 4.45 | 4.45 |
| Irganox 1010 | 0.89 | 0.89 | 0.89 |
| Si-75 | 0.53 | 0.53 | 0.53 |
| KBM-403E | 0.53 | 0.53 | 0.53 |
| GE-36 | 5.34 | — | — |
| D.E.R. 732 | — | 5.34 | — |
| D.E.R. 736 | — | — | 5.34 |
| EPON 828 | 3.56 | 3.56 | 3.56 |
| CXC-1761 | 0.18 | 0.18 | 0.18 |

Examples 12-14

The procedures of Examples 9-11 were substantially repeated in these Examples 12 to 14 except for using polymer of Example 5 and various ingredients as listed in Table 3.

TABLE 3

| Ingredients (g) | Example 12 | Example 13 | Example 14 |
| --- | --- | --- | --- |
| TrisP-3M6C-2-201 | 4.45 | 4.45 | 4.45 |
| Irganox 1010 | 0.89 | 0.89 | 0.89 |
| Si-75 | 0.53 | 0.53 | 0.53 |
| KBM-403E | 0.53 | 0.53 | 0.53 |
| GE-36 | 5.34 | — | — |
| D.E.R. 732 | — | 5.34 | — |
| D.E.R. 736 | — | — | 5.34 |
| EPON 828 | 3.56 | 3.56 | 3.56 |
| CXC-1761 | 0.18 | 0.18 | 0.18 |

Example 15

The procedures of Examples 9-11 were substantially repeated in this Example 15 except for using polymer of Example 8 and various ingredients as listed in Table 4.

TABLE 4

| Ingredients (g) | Example 15 |
| --- | --- |
| TrisP-3M6C-2-201 | 4.45 |
| Irganox 1010 | 0.89 |
| Si-75 | 0.53 |
| KBM-403E | 0.53 |
| GE-36 | 5.34 |
| ETON 828 | 3.56 |
| CXC-1761 | 0.18 |

Comparative Examples 3-5

The procedures of Examples 9-11 were substantially repeated in these Comparative Examples 3 to 5 except for using polymer of Comparative Example 1 and various ingredients as listed in Table 5.

TABLE 5

| Ingredients (g) | Comparative Example 3 | Comparative Example 4 | Comparative Example 5 |
| --- | --- | --- | --- |
| TrisP-3M6C-2-201 | 4.45 | 4.45 | 4.45 |
| Irganox 1010 | 0.89 | 0.89 | 0.89 |
| Si-75 | 0.53 | 0.53 | 0.53 |
| KBM-403E | 0.53 | 0.53 | 0.53 |
| GE-36 | 5.34 | — | — |
| D.E.R. 732 | — | 5.34 | — |
| D.E.R. 736 | — | — | 5.34 |
| EPON 828 | 3.56 | 3.56 | 3.56 |
| CXC-1761 | 0.18 | 0.18 | 0.18 |

Comparative Example 6

The procedures of Examples 9-11 were substantially repeated in this Comparative Example 6 except for using polymer of Comparative Example 2 and various ingredients as listed in Table 6.

TABLE 6

| Ingredients (g) | Comparative Example 6 |
| --- | --- |
| TrisP-3M6C-2-201 | 4.45 |
| Irganox 1010 | 0.89 |
| Si-75 | 0.53 |
| KBM-403E | 0.53 |
| GE-36 | 5.34 |
| EPON 828 | 3.56 |
| CXC-1761 | 0.18 |

Example 16

Spin Coating Procedures

The photosensitive compositions made in accordance with procedures as set forth in Examples 9 to 15 and Comparative Examples 3 to 6 were spun coated onto a suitable substrate using the following spin protocol: The compositions of Examples 9 to 15 and the Comparative Examples 3 to 6 were bought to ambient temperature before use and then were applied to a 125 mm diameter silicon wafer (wafer thickness: 725 μm) by spin coating at 500 rpm of 10 seconds and then at 1200 rpm for 30 seconds on a CEE-200 CB spin coater (Brewer Scientific). The substrate was then placed on a 120° C. hot plate for 3 minutes to remove residual solvent, providing a film with a thickness of 11.1 μm (post apply bake). Film thickness before exposure were measured by contact profilometry using a DekTak 150 stylus profilometer.

Example 17

Exposure and Aqueous Base Development

An AB-M contact mask aligner fitted with an I line (365 nm) band pass filter was used to imagewise expose the polymer film through a masking element using a range of exposure energies from 0-976 mJ/cm². The latent image was developed with 0.26 N TMAH solution (CD-26) using a puddle development method consisting of a 5 second spray and 70 second puddle immersion cycle. The wafer and patterned film was rinsed by spraying deionized water for 5 seconds to remove residual developer solvent and then dried by spinning at 3000 rpm for 15 seconds. The film was then evaluated with an Optiphot-88 microscope [Nikon] to determine the threshold energy (Eth) required to open a residue free, 10 μm isolated trench opening.

Figure 2:
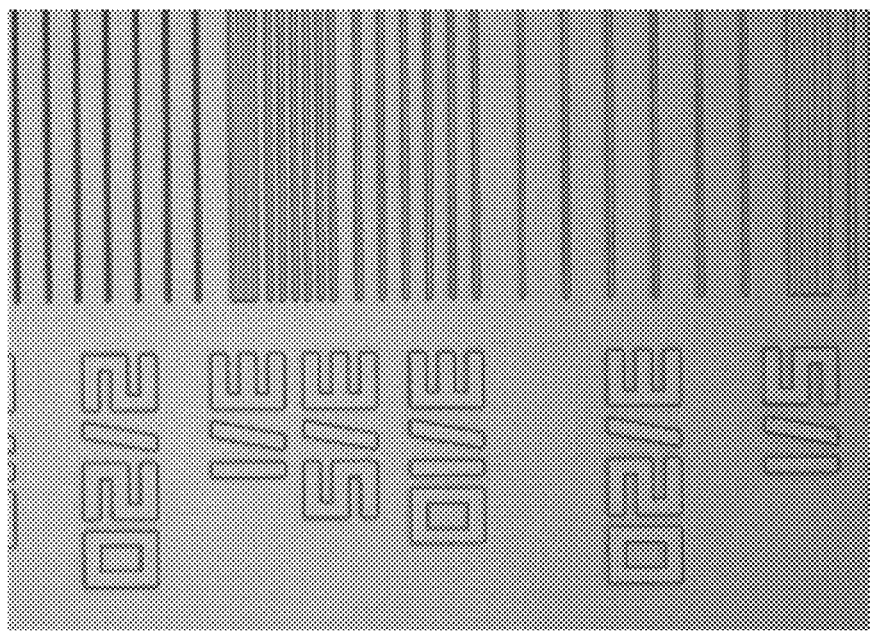
FIG. 2 shows an optical micrograph (5× magnification) of a positive tone lithographic images of one of the photosensitive composition embodiments of this invention after thermal cure.

FIG. 2 is a representative example of an image of the line and space pattern obtained from the photosensitive composition of Example 11. It is evident from FIG. 2 that excellent patterns with good resolution can be obtained by the photosensitive compositions of this invention.

Example 18

Dark Field Loss (DFL) Measurements

The film thickness after 0.26 N TMAH development and drying were measured using the Dektak 150. Dark field loss (DFL) was then calculated as a % change in film thickness as follows:

$$\% \ DFL = \left[ \frac{\text{Thickness after } PAB - \text{Thickness after } 0.26 \ N \ TMAH \text{ develop}}{\text{Thickness after } PAB} \right] \times 100$$

Where PAB is post apply bake as set forth in Example 16. The results of these measurements are summarized in Table 7.

TABLE 7

| Example No. | Photospeed (mJ/cm$^2$) | Line and Space resolution (μm) | Dark Field Loss percentage (%) | Total 0.26N TMAH develop time (seconds) |
|---|---|---|---|---|
| 9 | 255 | 3 | 40 | 72 |
| 10 | 255 | 3 | 24 | 72 |
| 11 | 327 | 25 | 15 | 72 |
| 12 | 327 | 3 | 24 | 35 |
| 13 | 327 | 5 | 19 | 35 |
| 14 | 405 | 3 | 12 | 45 |
| 15 | 455 | 5 | 2 | 35 |
| Comp. Ex. 3 | 327 | 3 | 28 | 35 |
| Comp. Ex. 4 | 327 | 3 | 33 | 40 |
| Comp. Ex. 5 | 327 | 3 | 33 | 40 |
| Comp. Ex. 6 | 404 | 3 | 36 | 15 |

It is evident from the data presented in Table 6 that all of the compositions of this invention showed quite acceptable dark field loss (DFL). Generally, DFL less than 20% at a development time of less than 20 seconds is considered good. As seen from the data in Table 6, the composition of Example 9 had the highest DFL of 40% but also had a longest develop time of 72 seconds. Whereas the composition of Comparative Example 6 had a DFL of 36% even at 15 seconds. Similarly, the compositions of Comparative Examples 3 to 5 also showed generally high DFL of 28%, 33% and 33% at relatively long develop time of 35 or 40 seconds. This clearly demonstrates the superior properties of the compositions of this invention.

Example 19

Thermal Pattern Reflow During Thermal Cure

Figure 3A:
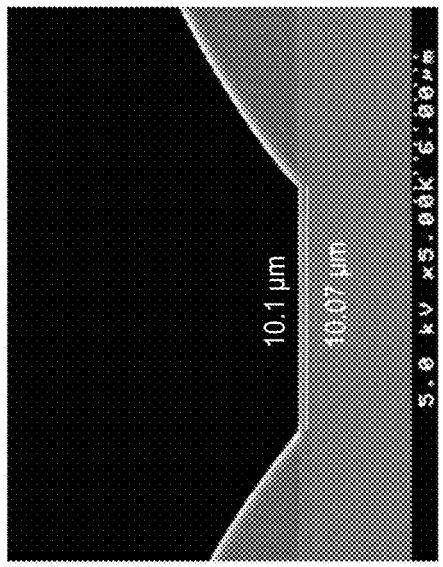
FIG. 3A and FIG. 3B show cross section scanning electron micrographs (SEM) of a positive tone lithographic images of 10 μm isolated trenches before (FIG. 3A) and after (FIG. 3B) thermal cure of one of the photosensitive composition embodiments of this invention.
Figure 3B:
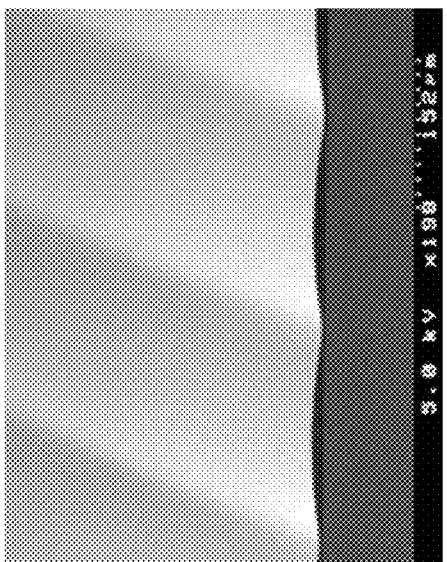

A 125 mm diameter silicon wafer (wafer thickness: 725 μm) was coated with composition of Example 10 and latent mask pattern was transferred into the film by exposing the photoactive film to an exposure dose of 255 mJ/cm$^2$ 365 nm UV radiation and developing the latent image with 0.26N TMAH developer as described in Example 17. The wafer was cleaved into two halves. One half of the wafer was placed in a Despatch oven. The oven was purged with nitrogen gas and then the wafer was heated to 180° C. at a rate of 10° C. per minute and the sample was maintained at 180° C. for 120 minutes. The oven was then allowed to cool to 45° C. before the wafer was removed from the oven. The samples were submitted for cross section analysis on a Hitachi S-4500 Field-Emission Gun Scanning Electron Microscope (SEM). FIGS. 3A and 3B show cross section images before and after cure of the samples. It is evident from FIG. 3B, the dimension of the isolated 10.8 μm trenches before cure was substantially maintained at 10.1 μm after cure indicating very little thermal flow of the photosensitive composition of this invention.

Examples 20-25 and Comparative Examples 7 to 10

The procedures of Example 19 was substantially repeated in these Examples 20 to 25 except for employing various other photosensitive compositions of Examples 9 and 11 to 15 and the compositions of Comparative Examples 3 to 6. In each of these Examples 20 to 25 and Comparative Examples 7 to 10, SEM images were taken of the developed images before and after cure as described in Example 19 and the dimensions of the cross section of the images were measured. Table 8 summarizes the dimensions of the isolated 10 μm trench for each of these samples before and after thermal cure at 180° C. for 2 hours.

Figure 5:
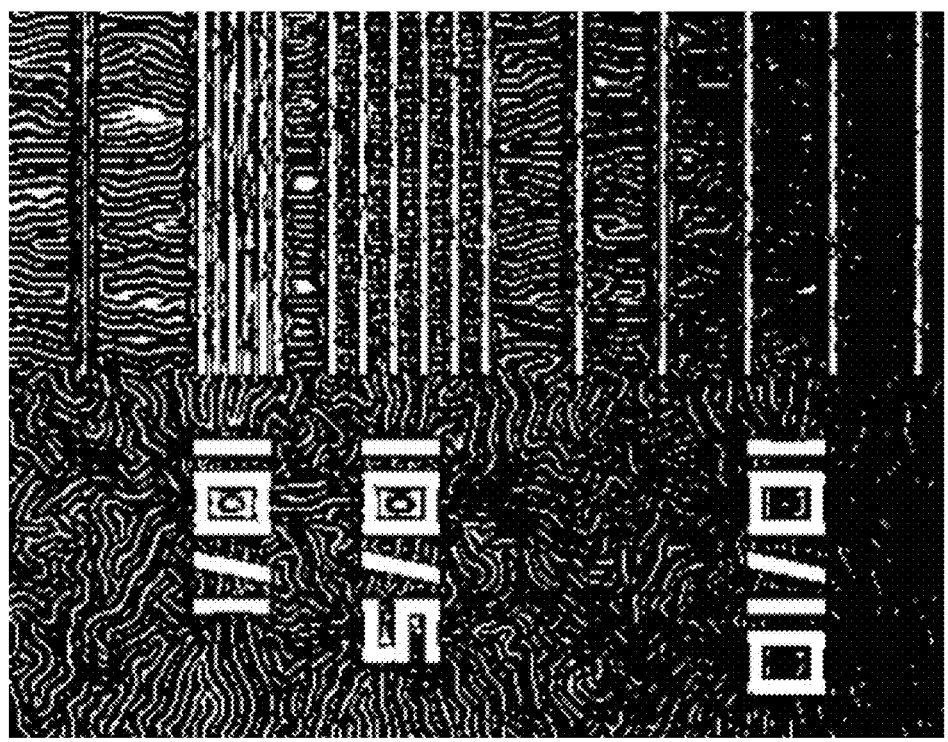
FIG. 5 shows an optical micrograph of a positive tone lithographic images of one of the comparative polymeric composition during thermal cure which clearly shows the wrinkling of the film.

It is very evident from this data that the dimensions of the images were mostly retained after thermal cure for all of the compositions of this invention. However, the integrity of the images were not always the same. For example, although the images obtained in Examples 21 and 24 retained the dimensions of the images but the images were significantly wrinkled. A representative example of this wrinkling effect is shown in FIG. 5, an optical micrograph of the developed film. It is evident from these results that various factors are involved in obtaining a desirable effect of the compositions of this invention based on the desirable results. Thus the compositions of this invention can be tailored based on the desired results of dimensional stability and various other requirements.

TABLE 8

| Example No. | Composition Example No. | Before cure (μm) | After Cure (μm) |
|---|---|---|---|
| 20 | 9 | 10.6 | 7.2 |
| 21 | 11 | 10.3 | 10.2 |
| 22 | 12 | 9.6 | 8.2 |
| 23 | 13 | 12.7 | 11.9 |
| 24 | 14 | 9 | 9 |
| 25 | 15 | 10.7 | 0 |
| Comp. Ex. 7 | Comp. Ex. 3 | 11.5 | 7.7 |
| Comp. Ex. 8 | Comp. Ex. 4 | 11.1 | 0 |
| Comp. Ex. 9 | Comp. Ex. 5 | 10.9 | 3.5 |
| Comp. Ex. 10 | Comp. Ex. 6 | 11.8 | 0 |

Figure 4A:
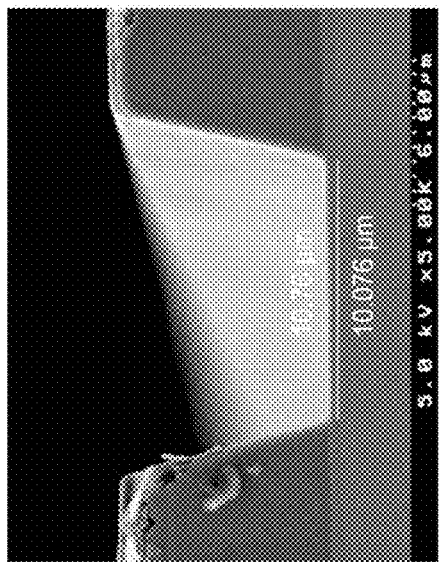
FIG. 4A and FIG. 4B show cross section scanning electron micrographs (SEM) of a positive tone lithographic images of 10 μm isolated trenches before (FIG. 4A) and after (FIG. 4B) thermal cure of one of the comparative photosensitive compositions where it is clear that the 10 μm trenches have flowed closed during thermal cure.
Figure 4B:
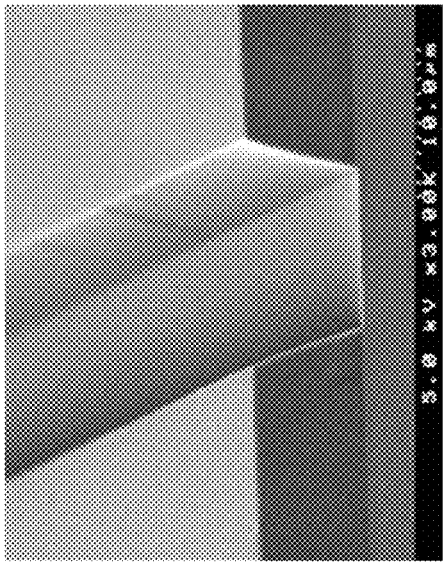

In addition, it should also be noted that the properties of the photosensitive compositions also depended on the type of polymer employed. For example, a photosensitive composition of Example 15, which was made from the polymer of Example 8 provided a relatively poor thermal stability as evidenced from Example 25 as summarized in Table 7. FIGS. 4A and 4B show cross section images before and after cure of the wafer samples obtained in this Example 25. It is evident from FIG. 4B that the polymer exhibited significant thermal flow after cure whereas the composition before cure exhibited extremely fine 10.7 μm trenches. On the other hand it is evident form the data presented in Table 7 that all of the Comparative Examples 7 to 10 exhibited poor thermal reflow properties after cure.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A polymer consisting of:

one or more distinct first repeating unit represented by formula (IA), each of said first repeating unit is derived from a monomer of formula (I):

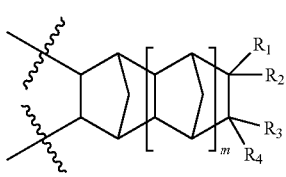
(IA)

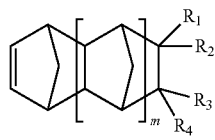
(I)

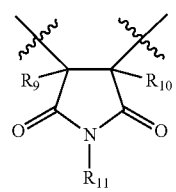
(IIIA)

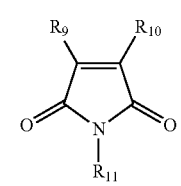
(III)

wherein:
- ⁓ represents a position at which the bonding takes place with another repeat unit;
- m is an integer 0, 1 or 2;
- $R_1$, $R_2$, $R_3$ and $R_4$ are each independently of one another selected from the group consisting of hydrogen, linear or branched $(C_1-C_{16})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, —$(CH_2)_a$—$(O-(CH_2)_b)_c$—O—$(C_1-C_4)$alkyl, where a, b and c are integers from 1 to 4, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, and halogen;

one or more distinct second repeating unit represented by formula (IIA), each of said second repeating unit is derived from a monomer of formula (II):

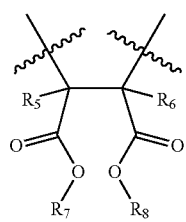
(IIA)

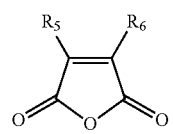
(II)

wherein:
- $R_5$, $R_6$, $R_7$ and $R_8$ are each independently of one another selected from the group consisting of hydrogen, linear or branched $(C_1-C_9)$alkyl, and fluorinated or perfluorinated$(C_1-C_9)$alkyl; and one or more distinct third repeating unit represented by formula (IIIA), each of said third repeating unit is derived from a monomer of formula (III):

wherein:
- $R_9$ and $R_{10}$ are each independently of one another selected from the group consisting of hydrogen, linear or branched $(C_1-C_{12})$alkyl, $(C_3-C_8)$cycloalkyl, $(C_6-C_{12})$aryl and $(C_6-C_{12})$aryl$(C_1-C_{12})$alkyl; and
- $R_{11}$ is selected from linear or branched $(C_1-C_{12})$alkyl, $(C_3-C_8)$cycloalkyl, $(C_6-C_{12})$aryl and $(C_6-C_{12})$aryl$(C_1-C_{12})$alkyl.

2. The polymer according to claim 1, wherein said polymer consisting of two or more distinct repeat units of formula (Ia).

3. The polymer according to claim 1, wherein
m is 0; and
$R_1$, $R_2$, $R_3$ and $R_4$ are each independently selected from the group consisting of hydrogen, linear or branched $(C_1-C_{12})$alkyl, phenyl$(C_1-C_3)$alkyl and —$(CH_2)_a$—$(O-(CH_2)_b)_c$—O—$(C_1-C_4)$alkyl, where a is 1 or 2, b is 2 to 4 and c is 2 or 3.

4. The polymer according to claim 1, wherein $R_5$ and $R_6$ are independently of each other selected from hydrogen and methyl; each $R_7$ and $R_8$ independently of one another selected from hydrogen, methyl, ethyl, n-propyl and n-butyl; $R_9$ and $R_{10}$ are independently of each other selected from hydrogen and methyl; and $R_{11}$ is selected from hexyl, cyclohexyl and phenyl.

5. The polymer according to claim 1, wherein said one or more first repeating unit is derived from a monomer selected from the group consisting of:
5-hexylbicyclo[2.2.1]hept-2-ene;
5-octylbicyclo[2.2.1]hept-2-ene;
5-decylbicyclo[2.2.1]hept-2-ene;
5-((2-(2-methoxyethoxy)ethoxy)methyl)bicyclo[2.2.1]hept-2-ene;
1-(bicyclo[2.2.1]hept-5-en-2-yl)-2,5,8,11-tetraoxadodecane;
5-benzylbicyclo[2.2.1]hept-2-ene; and
5-phenethylbicyclo[2.2.1]hept-2-ene.

6. The polymer according to claim 1, wherein said second repeating unit is derived from a monomer selected form the group consisting of:
maleic anhydride;
2-methyl-maleic anhydride (3-methylfuran-2,5-dione);
2,3-dimethyl-maleic anhydride (3,4-dimethylfuran-2,5-dione);
2-ethyl-maleic anhydride (3-ethylfuran-2,5-dione);
2,3-diethyl-maleic anhydride (3,4-diethylfuran-2,5-dione);
2-trifluoromethyl-maleic anhydride (3-trifluoromethylfuran-2,5-dione);

2,3-bis(trifluoromethyl)-maleic anhydride (3,4-bis(trifluoromethyl)furan-2,5-dione); and 2-methyl-3-trifluoromethyl-maleic anhydride (3-methyl-4-(trifluoromethyl)furan-2,5-dione).

7. The polymer according to claim 2, wherein said third repeating unit is derived from a monomer selected form the group consisting of:
  N-ethylmaleimide (1-ethyl-1H-pyrrole-2,5-dione);
  N-butylmaleimide (1-butyl-1H-pyrrole-2,5-dione);
  N-hexylmaleimide (1-hexyl-1H-pyrrole-2,5-dione);
  N-octylmaleimide (1-octyl-1H-pyrrole-2,5-dione);
  N-cyclopentylmaleimide (1-cyclopentyl-1H-pyrrole-2,5-dione);
  N-cyclohexylmaleimide (1-cyclohexyl-1H-pyrrole-2,5-dione);
  N-cycloheptylmaleimide (1-cycloheptyl-1H-pyrrole-2,5-dione);
  N-phenylmaleimide (1-phenyl-1H-pyrrole-2,5-dione); and
  N-benzylmaleimide (1-benzyl-1H-pyrrole-2,5-dione).

8. The polymer according to claim 1, wherein said first repeat unit is derived from:
  5-octylbicyclo[2.2.1]hept-2-ene;
  5-decylbicyclo[2.2.1]hept-2-ene;
  5-((2-(2-methoxyethoxy)ethoxy)methyl)bicyclo[2.2.1]kept-2-ene;
  1-(bicyclo[2.2.1]hept-5-en-2-yl)-2,5,8,11-tetraoxadodecane; and
  5-phenethylbicyclo[2.2.1]kept-2-ene;
  said second repeat unit is derived from maleic anhydride; and said third repeat unit is derived from:
  N-hexylmaleimide (1-hexyl-1H-pyrrole-2,5-dione);
  N-cyclohexylmaleimide (1-cyclohexyl-1H-pyrrole-2,5-dione); and
  N-phenylmaleimide (1-phenyl-1H-pyrrole-2,5-dione).

9. The polymer according to claim 1, wherein said first repeat unit is derived from:
  5-decylbicyclo[2.2.1]hept-2-ene;
  5-((2-(2-methoxyethoxy)ethoxy)methyl)bicyclo[2.2.1]hept-2-ene; and
  5-phenethylbicyclo[2.2.1]hept-2-ene;
  said second repeat unit is derived from maleic anhydride; and
  said third repeat unit is derived from:
  N-hexylmaleimide (1-hexyl-1H-pyrrole-2,5-dione);
  N-cyclohexylmaleimide (1-cyclohexyl-1H-pyrrole-2,5-dione); and
  N-phenylmaleimide (1-phenyl-1H-pyrrole-2,5-dione).

10. A layer forming composition comprising:
  a polymer consisting of:
  one or more distinct first repeating unit represented by formula (IA), each of said first repeating unit is derived from a monomer of formula (I):

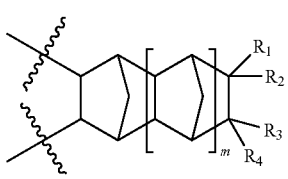

(IA)

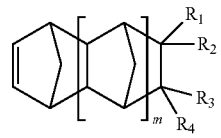

(I)

wherein:
  ⌇ represents a position at which the bonding takes place with another repeat unit;
  m is an integer 0, 1 or 2;
  $R_1$, $R_2$, $R_3$ and $R_4$ are each independently of one another selected from the group consisting of hydrogen, linear or branched $(C_1-C_{16})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, $—(CH_2)_a—(O—(CH_2)_b)_c—O—(C_1-C_4)$alkyl, where a, b and c are integers from 1 to 4, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, and halogen;
  one or more distinct second repeating unit represented by formula (IIA), each of said second repeating unit is derived from a monomer of formula (II):

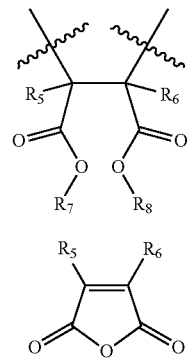

(IIA)

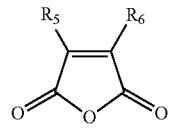

(II)

wherein:
  $R_5$, $R_6$, $R_7$ and $R_8$ are each independently of one another selected from the group consisting of hydrogen, linear or branched $(C_1-C_9)$alkyl, and fluorinated or perfluorinated$(C_1-C_9)$alkyl; and
  one or more distinct third repeating unit represented by formula (IIIA), each of said third repeating unit is derived from a monomer of formula (III):

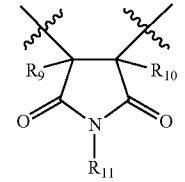

(IIIA)

-continued

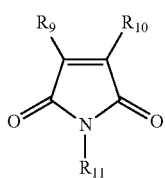
(III)

wherein:
R$_9$ and R$_{10}$ are each independently of one another selected from the group consisting of hydrogen, linear or branched (C$_1$-C$_{12}$)alkyl, (C$_3$-C$_8$)cycloalkyl, (C$_6$-C$_{12}$)aryl and (C$_6$-C$_{12}$)aryl(C$_1$-C$_{12}$)alkyl; and
R$_{11}$ is selected from linear or branched (C$_1$-C$_{12}$)alkyl, (C$_3$-C$_8$)cycloalkyl, (C$_6$-C$_{12}$)aryl and (C$_6$-C$_{12}$)aryl(C$_1$-C$_{12}$)alkyl;
a photo active compound;
an epoxy resin; and
a solvent.

11. The composition according to claim 10 where said polymer consisting of two or more distinct repeat units of formula (Ia).

12. The composition according to claim 10, wherein said first repeat unit of said polymer is derived from:
5-decylbicyclo[2.2.1]hept-2-ene;
5-((2-(2-methoxyethoxy)ethoxy)methyl)bicyclo[2.2.1]hept-2-ene; and
5-phenethylbicyclo[2.2.1]hept-2-ene;
said second repeat unit is derived from maleic anhydride; and
said third repeat unit is derived from:
N-hexylmaleimide (1-hexyl-1H-pyrrole-2,5-dione);
N-cyclohexylmaleimide (1-cyclohexyl-1H-pyrrole-2,5-dione); and
N-phenylmaleimide (1-phenyl-1H-pyrrole-2,5-dione).

13. The composition according to claim 10, wherein said photoactive compound comprises a 1,2-naphthoquinonediazide-5-sulfonyl moiety and/or a 1,2-naphthoquinonediazide-4-sulfonyl moiety as represented by structural formulae (VIIa) and (VIIb), respectively:

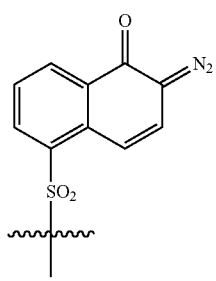
(VIIa)

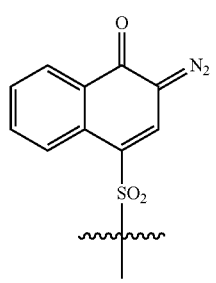
(VIIb)

or a sulfonyl benzoquinone diazide group represented by structural formula (VIIc):

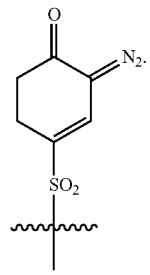
(VIIc)

14. The composition according to claim 13, wherein said photoactive compound is

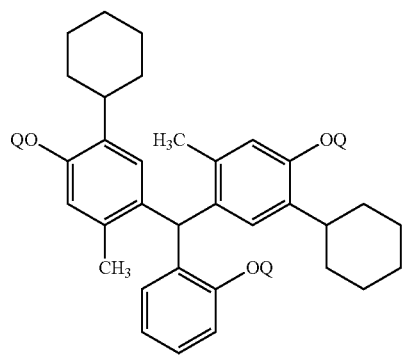

or

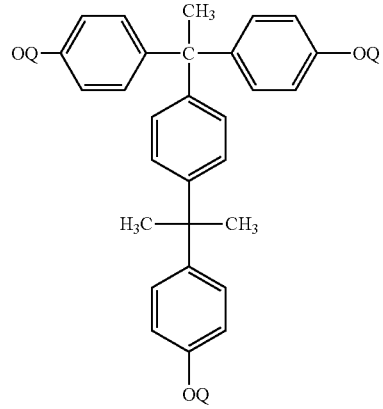

wherein at least one of Q is a group of formula (VIIa) or (VIIb):

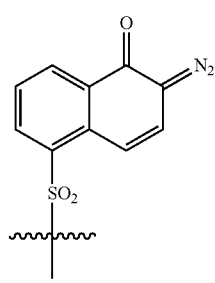
(VIIa)

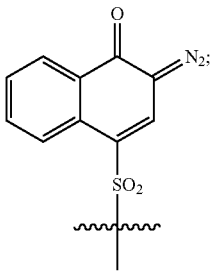
(VIIb)

and the remaining Q is hydrogen.

15. The composition according to claim 10, wherein said epoxy resin is selected from the group consisting of:
bisphenol A epichlorohydrin epoxy resin;
polypropylene glycol epichlorohydrin epoxy resin;
bis(4-(oxiran-2-ylmethoxy)phenyl)methane;
glycidyl ether of para-tertiary butyl phenol;
polyethylene glycol diglycidyl ether;
polypropylene glycol diglycidyl ether;
and a mixture in any combination thereof.

16. The composition according to claim 10, wherein said solvent is selected from the group consisting of propyleneglycol monomethylether acetate, gamma-butyrolactone, N-methylpyrrolidone and a mixture in any combination thereof.

17. The composition according to claim 10, wherein said solvent is propyleneglycol monomethylether acetate.

18. The composition according to claim 10, wherein said composition further comprises one or more additives selected from the group consisting of:
adhesion promoters;
antioxidants;
surfactants;
thermal acid or thermal base generator; and
mixtures in any combination thereof.

19. A process for forming a cured product, comprising:
(i) applying the layer forming composition of claim 10 on a substrate to form a coating film;
(ii) exposing the coating film to light through a desired pattern mask;
(iii) dissolving and removing the exposed portions by developing with an alkaline developer to obtain the desired pattern; and
(iv) heating the obtained desired pattern.

20. A cured product obtained by curing the layer forming composition of claim 10.

* * * * *